United States Patent
Puleston et al.

(10) Patent No.: US 10,681,133 B2
(45) Date of Patent: Jun. 9, 2020

(54) METHODS AND SYSTEMS FOR ENDPOINT DEVICE OPERATING SYSTEM IN AN ASSET INTELLIGENCE PLATFORM

(71) Applicant: TEGO, INC., Waltham, MA (US)

(72) Inventors: David Puleston, Duluth, GA (US); Leonid Mats, Bay Harbor Islands, FL (US); Ramji Sastri, Sharon, MA (US); Timothy P. Butler, Brookline, MA (US)

(73) Assignee: TEGO, INC., Waltham, MA (US)

( * ) Notice: Subject to any disclaimer, the term of this patent is extended or adjusted under 35 U.S.C. 154(b) by 235 days.

(21) Appl. No.: 15/707,319

(22) Filed: Sep. 18, 2017

(65) Prior Publication Data

US 2018/0131765 A1    May 10, 2018

Related U.S. Application Data

(60) Provisional application No. 62/396,664, filed on Sep. 19, 2016, provisional application No. 62/484,323, filed on Apr. 11, 2017.

(51) Int. Cl.
*H04L 29/08* (2006.01)
*G06K 7/10* (2006.01)
(Continued)

(52) U.S. Cl.
CPC ........ *H04L 67/1097* (2013.01); *G06F 16/907* (2019.01); *G06K 7/10366* (2013.01);
(Continued)

(58) Field of Classification Search
CPC . H04L 67/1097; H04L 67/2823; H04L 67/12; G06F 16/907; H04W 4/38;
(Continued)

(56) References Cited

U.S. PATENT DOCUMENTS 8,242,911 B2    8/2012 Moore et al.
8,279,065 B2    10/2012 Butler et al.
(Continued)

FOREIGN PATENT DOCUMENTS

| CN | 106779387 A | 5/2017 |
|---|---|---|
| WO | 2011118972 A2 | 9/2011 |
| WO | 2018053413 A1 | 3/2018 |

OTHER PUBLICATIONS

PCT/US2017/052034, "International Application Serial No. PCT/US2017/052034, International Search Report and the Written Opinion dated Dec. 28, 2017", 10 pages.
(Continued)

*Primary Examiner* — David R Lazaro
*Assistant Examiner* — Berhanu Shitayewoldetadik
(74) *Attorney, Agent, or Firm* — GTC Law Group PC & Affiliates

(57) ABSTRACT

In embodiments of the present disclosure improved capabilities are described for an asset intelligence platform for organizing information collected and stored on or with respect to large fleets of asset, such as used in connection with the Internet of Things, with capabilities for providing improved intelligence and security in the local environment of an asset, in the network and in remote locations, such as in the cloud.

18 Claims, 6 Drawing Sheets

(51) Int. Cl.
*G06Q 10/08* (2012.01)
*G06F 16/907* (2019.01)
*G11C 11/00* (2006.01)
*H04W 4/38* (2018.01)
*H04B 5/00* (2006.01)

(52) U.S. Cl.
CPC ............ *G06Q 10/087* (2013.01); *G11C 11/00* (2013.01); *H04L 67/2823* (2013.01); *H04W 4/38* (2018.02); *H04B 5/0062* (2013.01); *H04L 67/12* (2013.01)

(58) Field of Classification Search
CPC .. G06Q 10/087; G06K 7/10366; G11C 11/00; H04B 5/0062
USPC ........................................................ 709/217
See application file for complete search history.

(56) References Cited

U.S. PATENT DOCUMENTS

| | | | |
|---|---|---|---|
| 8,390,456 B2 | 3/2013 | Puleston et al. | |
| 8,988,223 B2 | 3/2015 | Puleston et al. | |
| 9,361,568 B2 | 6/2016 | Butler et al. | |
| 9,418,263 B2 | 8/2016 | Butler et al. | |
| 9,430,732 B2 | 8/2016 | Mats et al. | |
| 2004/0111338 A1 | 6/2004 | Bandy et al. | |
| 2005/0145688 A1* | 7/2005 | Milenkovic | G06Q 10/087 235/375 |
| 2006/0108411 A1 | 5/2006 | Macurek et al. | |
| 2007/0210923 A1 | 9/2007 | Butler et al. | |
| 2009/0006788 A1* | 1/2009 | Hunt | G06F 16/283 711/156 |
| 2009/0012971 A1* | 1/2009 | Hunt | G06Q 30/02 |
| 2013/0152092 A1* | 6/2013 | Yadgar | G10L 15/19 718/102 |
| 2013/0297422 A1* | 11/2013 | Hunter | G06Q 30/0261 705/14.58 |
| 2014/0145828 A1 | 5/2014 | Bassan-Eskenazi et al. | |
| 2014/0192676 A1* | 7/2014 | Sullivan | H04L 41/12 370/254 |
| 2016/0026837 A1* | 1/2016 | Good | G16Z 99/00 340/539.13 |
| 2016/0260301 A1* | 9/2016 | Miller | G08B 13/2417 |
| 2016/0321480 A1 | 11/2016 | Hamlin et al. | |
| 2017/0041296 A1* | 2/2017 | Ford | H04W 12/02 |
| 2017/0192414 A1* | 7/2017 | Mukkamala | G06F 3/04883 |
| 2017/0221011 A1* | 8/2017 | Von Sichart | G06Q 10/1093 |

OTHER PUBLICATIONS

PCT/US2017/052034, "International Application Serial No. PCT/US2012/066883, International Preliminary Report on Patentability and Written Opinion dated Mar. 21,2019", Tego, Inc., 8 pages.

PCT/US2019/016957, "International Application Serial No. PCT/US2019/016957, International Search Report and Written Opinion dated May 7, 2019", Tego, Inc., 7.

\* cited by examiner

METHODS AND SYSTEMS FOR ENDPOINT DEVICE OPERATING SYSTEM IN AN ASSET INTELLIGENCE PLATFORM

CLAIM OF PRIORITY

This patent application claims the benefit of the following provisional patent applications: U.S. Patent Application Ser. No. 62/396,664 filed Sep. 19, 2016 and U.S. Patent Application Ser. No. 62/484,323 filed Apr. 11, 2017.

CROSS-REFERENCE TO RELATED APPLICATIONS

This patent application is related to the following patent applications: U.S. patent application Ser. No. 11/609,277, filed Dec. 11, 2006; U.S. patent application Ser. No. 11/926,033, filed Oct. 28, 2007, now U.S. Pat. No. 8,279,065; U.S. patent application Ser. No. 12/393,863, filed Feb. 26, 2009, now U.S. Pat. No. 8,242,911; U.S. patent application Ser. No. 12/629,955, filed Dec. 3, 2009, now U.S. Pat. No. 8,390,456; U.S. patent application Ser. No. 13/671,323, filed Nov. 7, 2012, now U.S. Pat. No. 8,988,223; U.S. patent application Ser. No. 14/707,479, filed May 8, 2015, now U.S. Pat. No. 9,430,732; U.S. patent application Ser. No. 14/599,070 filed Jan. 16, 2015, now U.S. Pat. No. 9,361,568; U.S. patent application Ser. No. 14/870,731 filed Sep. 30, 2015, now U.S. Pat. No. 9,418,263; U.S. patent application Ser. No. 15/205,133 filed Jul. 8, 2016; U.S. Patent Application Ser. No. 60/749,645 filed Dec. 9, 2005; U.S. Patent Application Ser. No. 60/803,610 filed May 31, 2006; U.S. Patent Application Ser. No. 60/803,612 filed May 31, 2006; U.S. Patent Application Ser. No. 60/868,107 filed Dec. 1, 2006; U.S. Patent Application Ser. No. 60/915,838 filed May 3, 2007; U.S. Patent Application Ser. No. 60/983,193 filed Oct. 28, 2007; U.S. Patent Application Ser. No. 61/031,590 filed Feb. 26, 2008; U.S. Patent Application Ser. No. 61/119,595 filed Dec. 3, 2008; U.S. Patent Application Ser. No. 61/182,776 filed Jun. 1, 2009; U.S. Patent Application Ser. No. 61/238,430 filed Aug. 31, 2009; U.S. Patent Application Ser. No. 61/556,359, filed on Nov. 7, 2011; U.S. Patent Application Ser. No. 61/990,349, filed on May 8, 2014; U.S. Patent Application Ser. No. 62/057,277, filed on Sep. 30, 2014; U.S. Patent Application Ser. No. 62/063,588, filed on Oct. 14, 2014; U.S. Patent Application Ser. No. 62/190,230, filed on Jul. 8, 2015; U.S. Patent Application Ser. No. 62/290,585, filed on Feb. 3, 2016.

All of the above patent applications and patents are incorporated herein by reference in their entirety.

BACKGROUND

This disclosure relates to an information technology and computing platform for storage, retrieval, computation, processing, integration, distribution and management of asset information associated with wireless endpoint devices that are disposed on or associated with assets, including tags (e.g., RF tags, magnetic induction tags).

With the advent of the Internet of Things, enterprises and other users are increasingly focusing on acquiring information from and about their assets, and assets are increasingly deployed with technology features that provide greater intelligence, including having data storage and processing integrated into assets where they were previously absent and surrounding assets with collections of sensors and instruments that capture information relevant to the asset and its environment, such as to enable remote monitoring, remote control, and/or autonomous actions by the asset based on such information. However, the proliferation of intelligent assets presents a number of significant challenges. For example, network bandwidth may be insufficient to handle increases in volume of traffic, in particular as assets communicate with each other in machine-to-machine configurations. Also, enterprises data storage systems (such as ones using cloud platforms) may have difficulty effectively managing the input/output flow of information, the organization and storage of information, the speed at which intelligent solutions require processing, the sheer volume of information that can be stored, and the need to keep asset information and the networks over which information travels secure (such as against cyber attacks). Accordingly, a need exists for improved methods and systems for handling asset intelligence, including methods and systems for organizing the collection, storage, and management of asset information. This includes situations in which information about or used in connection with assets is handled by wireless endpoint devices that are disposed on or associated with assets, such as asset tags, including RFID tags. References to "tags" and a "tag operating system" throughout this disclosure should be understood to encompass, except where context indicates otherwise, various such wireless endpoint devices and an operating system for handling endpoint device information associated with assets.

The challenges with cloud and networking technologies also create a need for greater intelligence on the asset itself or in the local environment of the asset (referred to in some cases as the "edge" of a network). However, local or edge intelligence presents challenges of its own, as assets may not have access to adequate data storage for the information that is collected by or about them, and assets may not have access to consistent available power for computing and processing operations. Accordingly, a need also exists for improved methods and systems for capturing, storing, securing, and processing information on assets or in the local environment of assets.

There are a number of problems and challenges associated with asset management solutions that use a centralized database, such as indexed by an asset ID-based solutions. One of these problems is database complexity, in particular where data sets may arise with several large segments that are stored in different places, such as on different services or across different enterprises. Having a large amount of data about an asset is often not enough; instead, a solution needs the right data, in the right place, at the right time. That has long been the challenge in industries involving complex systems (like the aerospace industry), where plenty of data is recorded, but the parties doing the recording are quite diverse (e.g., including original part manufacturers, various subcontractors, installers (such as the airframers who install an aircraft part), operators (such as the airlines who operate the aircraft), separate maintenance and repair (MRO) organizations (such as ones that maintain or service an aircraft and its parts), and owners (such as leasing companies who own an aircraft). When it comes time to overhaul a part of a complex system, collecting the right information can be particularly burdensome, and as new information is generated there is typically no agreed-upon location to use for universal access. A need exists for solutions where the right data can be accessed at the right time and place.

Another problem with prior asset management solutions is the challenge of assuring correspondence between an asset and the data that has been collected. A party may have gone to the trouble of storing data related to an item. Others in the supply and use chain may have done the same, so potentially relevant information is stored in multiple places. After pulling all this data together, there is still the fundamental question: "Does all this information correspond to the item in my hands, or is it for a different part that looks just like this one?"

Even in cases of systems based on elaborate identification schemes (such as the metal nameplates on aircraft parts or identification numbers stamped on automobiles), establishing correspondence of information with database entries is not simple. Nameplates or stamps can be in locations that make reading the numbers difficult, and the numbers are not typically large enough, making transcription errors common. Even if the correct numbers are retrieved, correspondence with databases is never easy as long numbers are often formatted differently, or the databases are indexed with different numbering schemes. Thus, a need exists for methods and systems that assure correspondence between information and an item to which it potentially relates.

Another challenge in existing asset tracking systems where information is distributed is the complexity of deployment of information technology architecture, including centralized servers. In many asset deployments, users mark assets (such as with an identification number) and store the rest of the data about an asset in a central database. Setting up and maintaining a shared database that can be updated by multiple individuals and possibly multiple departments within an organization, as well as indexed by RFID readers so that information can be accessed in the field, requires considerable infrastructure. That same infrastructure becomes even more complex if information is to be shared outside of the organization, such as with trading partners or even with customers. Thus, a need exists for reduction of complexity and extent of infrastructure required to maintain an asset management solution.

Another challenge is with communications. When information is handled centrally, lines of communication need to be established for providing various constituencies and stakeholders with information about the asset over time. This often includes setting up a website or a centralized database (with access controls, alerting, and reports) and ensuring sufficient networking and other infrastructure to enable communications. A need exists for asset management solutions with simplified communications.

Another challenge is unreliable or intermittent network connectivity. As ubiquitous as cell phone connectivity has become, all mobile handsets store the user's contact database and calendar entries locally on the handset and synchronize with the database at regular intervals. Relying on a cloud connection for phone number lookup or other critical information is simply too unreliable. The practical reality is that most cloud computing scenarios work better when some amount of distributed local storage is periodically synchronized with the larger cloud environment. In order for a centralized database, indexed by identifiers for asset tags or other endpoint wireless devices associated with assets, to work, a reading device, such as an RFID reader, needs to be connected either to a network or to a host computer that stores the central database. If the reader-network connection is ever impaired, most operations would be forced to halt. A need exists for solutions that address unreliable or intermittent network connectivity in asset management solutions.

Another problem with existing solutions is that network operations can be too slow to support necessary operations. While raw networking speeds today are fast and getting faster, other factors, such as connection handshaking, protocol negotiation requirements, time of flight latency and ever-present network congestion all conspire to make initiating a network transfer painfully slow. In addition to the connection uptime concerns outlined above, perhaps the bigger reason for storing information like contact databases locally on the handset is that lookup over the cloud is often too slow for practical usage. A need exists for asset management solutions that allow rapid operations and decision-making regardless of the speed or capacity of available network operations.

Another problem with existing asset management solutions is the difficulty in sharing information while maintaining confidentiality. There are many examples of assets that move among many different enterprises throughout the asset's lifetime. The aerospace example described above is one good illustration. In most cases, the players tend to agree that there are benefits to be gained by sharing data about an asset, but the benefits may not be worth the risk of exposing internal corporate databases to users from other enterprises. A need exists for methods and systems that enable sharing of information while preserving confidentiality.

Another problem with existing asset management solutions is the insecurity of centralized databases. This problem extends the concept of data confidentiality. There are cases where keeping an internal database secured is not enough. Instead, the mere existence of a database is seen to be a risk, so a distributed data solution becomes mandatory. For example, in some cases security only goes so far, and having a database potentially fall into the wrong hands is perceived to be not a matter of "if" but "when." Also, other concerns including being forced to turn over the contents of a database, such as under government order or subpoena. For example, during the era of mad cow disease, some ranchers were interested in storing birth certificates and medical histories for each animal only on the animal. One of their concerns was that under subpoena, they would have to open up the medical records for their entire herd, so it was preferable to not have that central database exist at all. A need exists for methods and systems for asset intelligence that avoid the need for a centralized database.

Another problem with existing asset management systems is asset authentication. An identification number alone is often simply inadequate to verify that an asset is authentic, even if the ID number is stored in an electronic form. Identification numbers can be copied from known-good values or ranges of values, and when placed onto counterfeit parts, it can be difficult or impossible to tell that a number has been reused. A need exists for methods and systems that provide asset authentication.

Many endpoint devices associated with assets, such as asset tags, such as RFID tags, typically contain an EPC (electronic product code or equipment production code) number, which identifies the item being tagged. This number is commonly composed of a manufacturer's ID, an identifying part number, and a serial number. The EPC number is often programmed as part of the asset tagging process so that serialization can be controlled and correlated with other identification schemes. After the EPC number is programmed, it is usually made permanent using one of the permalock methods included in the RFID protocol. However, it is an easy matter to program a new RFID tag using an EPC number copied from an existing tag, thus creating a forged identification. Forged tags can be used to create new keycards for unauthorized entry, to effect price changes at point of sale, or for any other purpose where a forged identity is useful. A need exists for methods and systems to prevent cloning and counterfeiting of asset tags.

SUMMARY

An asset intelligence platform is provided for organizing information collected and stored on or with respect to large fleets of asset, such as used in connection with the Internet of Things, with capabilities for providing improved intelligence and security in the local environment of an asset, in the network and in remote locations, such as in the cloud.

Embodiments of the present disclosure relate to providing distributed memory in a smart asset solution, including using distributed memory to address a number of challenges that arise from systems that rely on storing most or all the information about the asset in a central database, such as where an ID number for an asset is used to index the database.

In embodiments, methods and systems are disclosed for handling distributed asset data such that the right data travels as part of the asset, so that it is always available, in the right place at the right time.

In embodiments, methods and systems are disclosed for assuring that information about an item is associated with the item, including methods and systems for storing the information directly on the item.

In embodiments, methods and systems are disclosed wherein deployment of information technology architecture for a smart intelligent solution is simplified.

In embodiments of an asset intelligence platform, a central database may be combined with distributed storage at the endpoints, such as storing information on a high memory asset tag. In other embodiments, there is no need to store any data centrally, so the data at the endpoints or assets becomes the database.

Embodiments of the present disclosure include methods and systems for simplifying communications about assets with various constituencies and stakeholders.

Embodiments of the present disclosure include methods and systems for addressing absent or intermittent network connectivity.

Embodiments of the present disclosure include methods and systems of an asset management platform that allow rapid operations regardless of the speed or capacity of available network operations.

Embodiments of the present disclosure include methods and systems for sharing of information while preserving confidentiality.

Embodiments of the present disclosure include methods and systems for asset intelligence that avoid the need for a centralized database.

Embodiments of an intelligent asset platform are disclosed that include methods and systems for providing asset authentication.

Embodiments of an intelligent asset platform include anti-cloning and anti-counterfeiting methods and systems.

BRIEF DESCRIPTION OF THE FIGURES

The following disclosed embodiments may be understood by reference to the following figures.

While the following has been described in connection with certain preferred embodiments, other embodiments would be understood by one of ordinary skill in the art and are encompassed herein.

DETAILED DESCRIPTION

Figure 1:
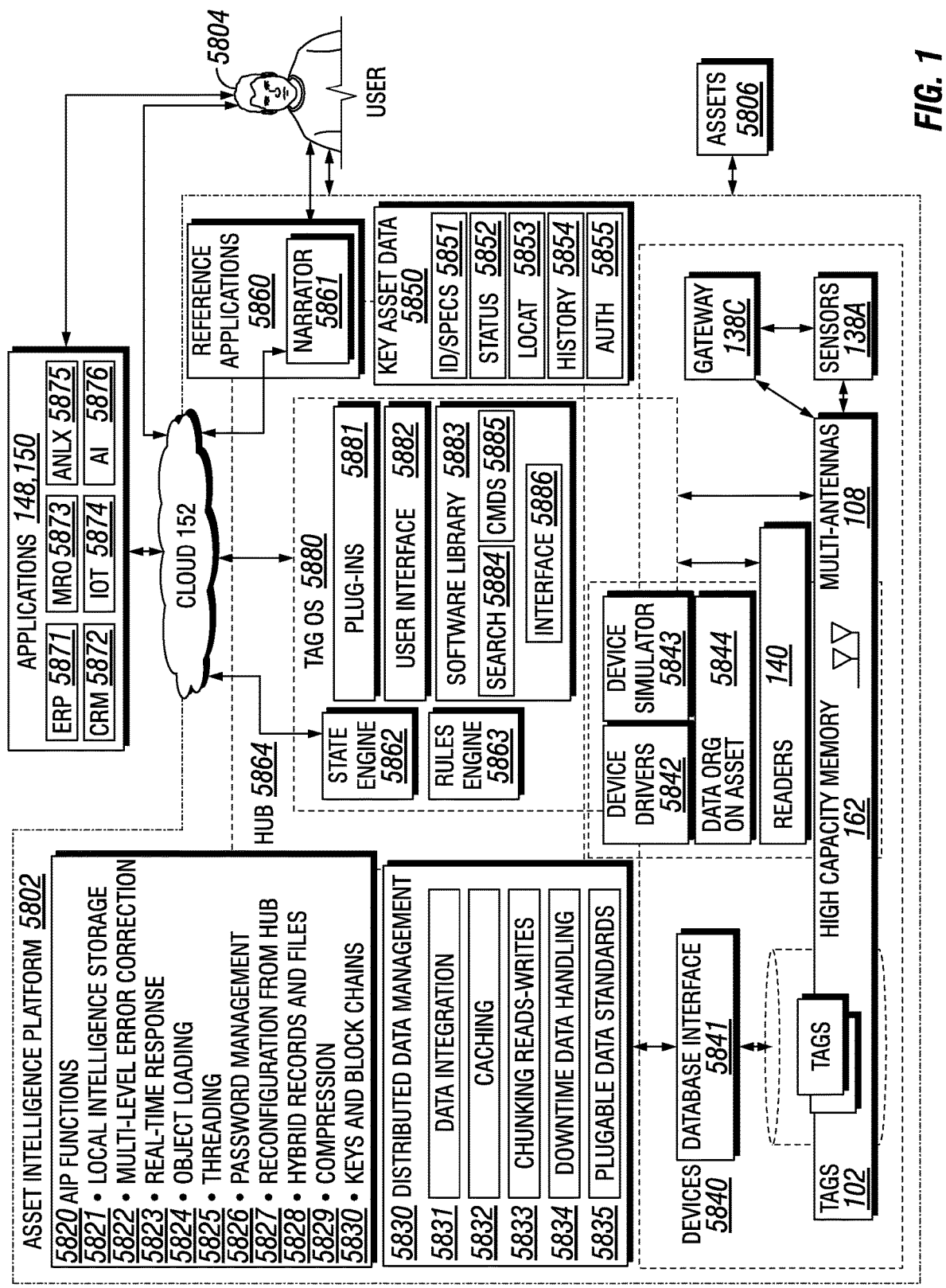
FIG. 1 depicts a top-level functional diagram of a tag operating system within an asset intelligence platform.

With reference to FIG. 1, in embodiments of the methods and systems described herein, a tag operating system 5880, as described throughout this disclosure, may be included in a platform that incorporates various components, modules, services, functions, and capabilities for enabling a comprehensive asset intelligence platform 5802 that integrates with various cloud computing 152 platforms and technologies 148, 150 and that comprehensively supports deployments of tagged assets 5806 and associated key asset data 5850 (e.g., identification and specifications 5851, status 5852, location 5853, history 5854, authenticity 5855) that have embedded intelligence, that are surrounded by sensors 138A or other instrumentation, that communicate with each other and with the cloud 152, and that otherwise display capabilities associated with the Internet of Things (IoT). A user 5804 may interface 5882 with the asset intelligence platform 5802 through the tag operating system 5880, where the tag operating system 5880 may comprise a layered structure that enables the user 5804 to interface through plug-ins 5881 to cloud facilities 148, 150, 152 (e.g., application, market, and enterprise resources), and to tags 102 (e.g., RF tags, magnetic induction tags, also referred to herein as RF asset tags) associated with assets 5806, such as through utilization of software library resources 5883. In embodiments, the tag operating system 5880 may enable a user 5804 to remotely store and read information with a plurality of RF asset tags 102 across a computer network 152 and through a plurality of RF asset tag access devices 140 by operating within a user interface of a computing device, without regard to intervening interfaces and protocols associated with computing facilities communicatively connected between the computing device (e.g., a computing device of the user 5804; a computing device of an enterprise application 148, 150; a computing device of the asset intelligence platform 5802, and the like) and the plurality of RF asset tags 102. In embodiments, a user computing device may include navigation devices, cell phones, mobile phones, mobile personal digital assistants, laptops, palmtops, netbooks, augmented reality (AR) devices, virtual reality (VR) devices, head-worn devices, body-worn devices, pagers, electronic books readers, music players, and the like, such as used stand-alone, networked, off-line, in communication with an RF reader 140, integrated with an RF reader 140, and the like.

The tag operating system 5880 may include additional system resources, such as an information hub 5864, reference applications 5860 and narrator facility 5861, a state engine 5862, a rules engine 5863, distributed data management resources 5830, and a plurality of asset intelligence platform functions 5820. Asset intelligence platform access to tagged 102 assets 5806 may be realized through device drivers 5842, readers 140 (also referred to herein as RF interrogators, RF asset tag access devices, and the like), gateways 138C, and the like. Stored asset data, such as stored on singular or on a plurality of tags 102, may be organized by asset 5844, market 150, application 148, and the like, such as stored in a database through a database interface 5841. Tags 102 may be capable of storing data on high capacity memory stores 162, operate in conjunction with other tags 102, communicate through multiple antennas 108, interface with sensors, interface with other computing systems through readers, gateways, other tags, and the like. In addition, hardware and software systems of the asset intelligence platform 5802 may be simulated, such as through device simulators 5843 (e.g., reader simulator, tag simulator, tag database simulator, and the like), where an enterprise is able to simulate an asset deployment.

The tag operating system 5880 of the asset intelligence platform 5802 may include or be integrated with various components and sub-components, including a comprehensive software library 5882 to securely store directly on and retrieve structured or unstructured data from any tagged asset 5806 (including via tags 102 having various capabilities noted throughout this disclosure and the documents incorporated herein by reference), a narrator application 5861 as described elsewhere in this disclosure, which may be available on major mobile and PC operating systems (e.g., Windows™, iOS™ Android™, Mac™, Linux™ and the like) that enables administrators and users to handle collections of tags 102 for their assets; and components enabling integration with cloud-based IoT platforms, enterprise IT systems and dashboards, and other platforms that consume or use IoT information. The asset intelligence platform 5802 may include a range of feature and attributes that enable rapid, effective IoT deployments, such as providing the ability for users 5804 to implement a smart asset solution for any domain rapidly, including by treating tagged physical assets 5806 in the same way that other IT assets, such as files and databases, are handled by an enterprise. An end user 5804 in any domain can thus use an asset deployment without acquiring extensive knowledge about tags 102 (such as RF characteristics, characteristics of readers, or the like). Because of this simplicity, deployments can be for almost any domain, such as a pharmacy, a lawyer's office, tracking of jewelry, keeping track of laundry, or many others.

In embodiments, the tag operating system 5880 encompasses an open, multi-platform operating system which adds new capability to the innovative Asset Intelligence Platform 5802, which provides local intelligence on any asset 5806, anywhere. Assets 5806 may include any of the devices, machines, systems, articles of manufacture, tools, instruments, vehicles, components, parts, or other items described throughout this disclosure or as would be understood by one of ordinary skill in the art. In embodiments, the tag operating system can support and seamlessly integrate with a variety of mobile, desktop, server and other operating systems, including iOS, Android, Windows, OS X, Linus, embedded based systems, and the like. The open tag operating system may operate across a plurality of wireless gateway protocols and handheld readers 140. It also may enable distributed data about assets 5806 to be easily available to any cloud-based Internet of Things (IoT) platform 5874 as well as core enterprise systems such as Enterprise Asset Management (EAM), Enterprise Resource Planning (ERP) 5871, Customer Resource Management 5872, Maintenance, Repair, and Operations facilities 5873, Business Intelligence (BI) and analytics 5875 applications and analytics 5875, and like information technology systems.

In embodiments, information handled by the asset intelligence platform may be used by an artificial intelligence system 5876, such as the Watson™ system provided by IBM, such as an artificial intelligence system deployed on a cloud platform. The artificial intelligence system 5876 may be used by analytics systems 5875, among other things, to identify patterns in data collected and handled in the asset intelligence platform 5802, such as data from tags, data about processes involving tags, data about users of tags, and the like.

Using the tag operating system 5880, assets 5806 can tell their story at the point of use by making their origin, authenticity, lifecycle maintenance history, or chain of custody available to authorized users 5804. The tag operating system 5880 empowers manufacturers, distributors and maintenance organizations across aerospace, life sciences, healthcare and manufacturing sectors to deploy scalable solutions for lifecycle and service management, regulatory and process compliance, and authenticity management. Out of the box, the tag operating system 5880 may provide encryption, compression and flexible and efficient file management. The process of storing data on a physical asset 5806 becomes a simple, one push-button activity.

The tag operating system 5880 may include plug-ins 5881, user interface facilities 5882, a comprehensive software library 5883 supporting Asset Intelligence Platform functionality and extensibility through search facilities 5884, command structure 5885, software library interface 5886, and the like, securely storing and retrieving structured or unstructured data directly on any asset 5806 through a wireless communications protocol. A mobile application for AIP administrators and users may be provided with one common interface to gateway devices 138C such as commercially available gateway devices, readers 140 and the like.

In embodiments, a provider of the asset intelligence platform may provide one or more plug-ins 5881 and a cloud-based enterprise software solution that is integrated with or a part of the asset intelligence platform 5802, which may be used as an alternative to third party platforms that may each use a dedicated plug-in. In embodiments, such a plug-in 5881 may work with a local database, such as one that can be stored on an iPad™ or similar mobile device, that may store asset definitions, documents/images, asset updates, and the like in local storage of the mobile device, such as to allow local usage of the platform features according to a defined process and other specifications for a given deployment. A pharmacy asset definition might, for example, define data about bottles, while an aviation deployment might refer to life vests. In embodiments, a hub may allow a user to define asset types, add images for those, define fields of information the user may want to capture, control licenses (how many devices this can be installed and used on), set application settings for readers (e.g., specify what is a good setting for the readers used by that user's enterprise), and push all of the foregoing out to devices that are used in deployment. Once information is defined, it can be sent to many devices, and they can be centrally or locally managed. Data can be backed up centrally or locally. Users can log in for reporting and analytics.

In embodiments, data may be obtained from a passive tag and sent to an enterprise system, increasing the value of the tag to the enterprise as that data can be disseminated appropriately across various users.

In embodiments, the tag operating system 5880 may provide a software library 5883 for interfacing with tagged assets, such as through an interface 5886 for accessing a diversity of Tags 102 through a diversity of readers 140, use of multi-step commands 5885 through a diversity of interfaces, ability to perform multi-criteria searching 5884 with tagged assets and interfaces, and the like.

The software library interface 5886 may provide a more efficient interface with and through readers 140 in access to Tags 102. For instance, the software library interface 5886 may provide threaded-parallel processing in read-write methods for communicating with tagged assets through a diversity of readers 140, such as to reduce overhead and increase communication speed through increased efficiency of interface algorithms, threading, and parallel processing. Thus, reader performance may be improved, such as across a diverse set of readers 140 being utilized in deployments of tagged assets. Such improvements may be further improved through increased memory capacity of Tags 102, such as through high-capacity memory 162, allowing Tags to implement greater interface capabilities with readers 140.

The software library 5883 may provide for multi-step commands 5885 through a diversity of interfaces, such as even if one or more readers used in a given deployment does not support such commands. The platform can take care of sequencing on the software side for multiple sequence commands in such situations. An example is where a user may search for something, such as an indicator of data on a tag, and if that indicator is found, then want to write something to that tag. For example, the user may want to write a piece of data to all tags that have a given type, which may be found by querying the tag for an indicator of the type. In conventional systems, such a process would require a user to handle single-command readers command-by-command. Use of the software library 5883 of the tag operating system 5880 may allow a user to set up such multi-step command processes by serializing commands to any of a variety of readers 140.

The software library 5883 may provide the ability to perform multi-criteria searching 5884 with tagged assets and interfaces, such as to search across a set of Tags 102 and readers 140 in an enterprise deployment of tagged assets. For instance, a search could be run to identify all Tags with a certain memory capacity, processing capacity, data content, tag ID structure, and the like, allowing a user 5804 to better manage tagged assets. Search functionality may include Boolean functions, such as AND, OR, and NOT, or smart search functions such as LIKE and SIMILAR, and the like. For example, a search could be run for all tags by company 'A' with 8 KB memory capacity that has an EPC starting with 1830. Through this functionality a user may be able to search through tag characteristics, hardware capabilities, software capabilities, stored tag data content, tag and reader interface capabilities, and the like. Additionally, multi-criteria searching may provide the ability to search on a time function, such as searching for an activity or action performed within a specified period. For example, searching for writes to tags performed during a six-hour period.

The tag operating system 5880 powers the Asset Intelligence Platform 5802, which provides the capability to embed digital information directly in the asset 5806 itself. From product specification and configuration, maintenance and use history, and intended use and compatibility, to process instructions or images, the Asset Intelligence Platform 5802 allows distributed data solutions to be installed quickly within small or large environments—providing line employees with critical operating data and ensuring asset data connectivity to devices and to IOT platforms and enterprise systems. The tag operating system 5880 greatly simplifies the process of storing, recalling and communicating the information embedded in a product, component or asset, such as through information hub facilities 5864, reference applications 5860 and narrator facility 5861, a state engine 5862, and a rules engine 5863.

The information hub 5864 may handle information for assets 5806 from various locations. The hub 5864 may be enabled by a cloud platform, such that various information, such as asset definitions, documents and images, asset updates, customer information, licensing information, application settings, and the like can be managed through the hub 5864 for multiple asset tags in various locations. In embodiments the hub 5864 may act as a software management layer for multiple devices 5840, such as enabling provisioning of devices, handling status information for devices, providing licenses to devices, tracking devices, providing security for devices, and providing a connection between devices and other components of the asset intelligence platform 5802, users 5804, and the cloud 148, 150, 152. The hub 5864 may also include data storage, such as asset data, on which analytics 5875 can be run. The hub 5864 may offer access to the data through one or more interfaces, which may include user interfaces and/or application programming interfaces. Thus, the hub 5875 may store data, route data, and facilitate use of data by applications or for analytics 5875.

In embodiments, the tag operating system 5880 may include a variety of modules, including the following: 1) In Cloud Modules: Customer Admin Web (Asset Type Creation, Application Setting, Sync To Devices, Documentation Management); Customer Management Web (Reports); Database (Asset Definition, Asset Records, Documents, Images, Settings; Web Services for syncing information); Admin Web (License Management), and/or 2) On Devices (Narrator): Application (reader management, Local Storage (Offline) & Sync Manager, Reports/User Interface). In embodiments, the tag operating system 5880 may be provided in connection with the narrator 5861, which, in some cases together with the hub, may support various uses, including: License Creation for Customer; Customer Registration; Asset Type Creation; Asset Definition (Fields, Images, Documents); Setup (Application Settings); Login to Device; Asset Commissioning; Asset Updates; Part Audit; Reports on Web; an Reports on Application.

Figure 2:
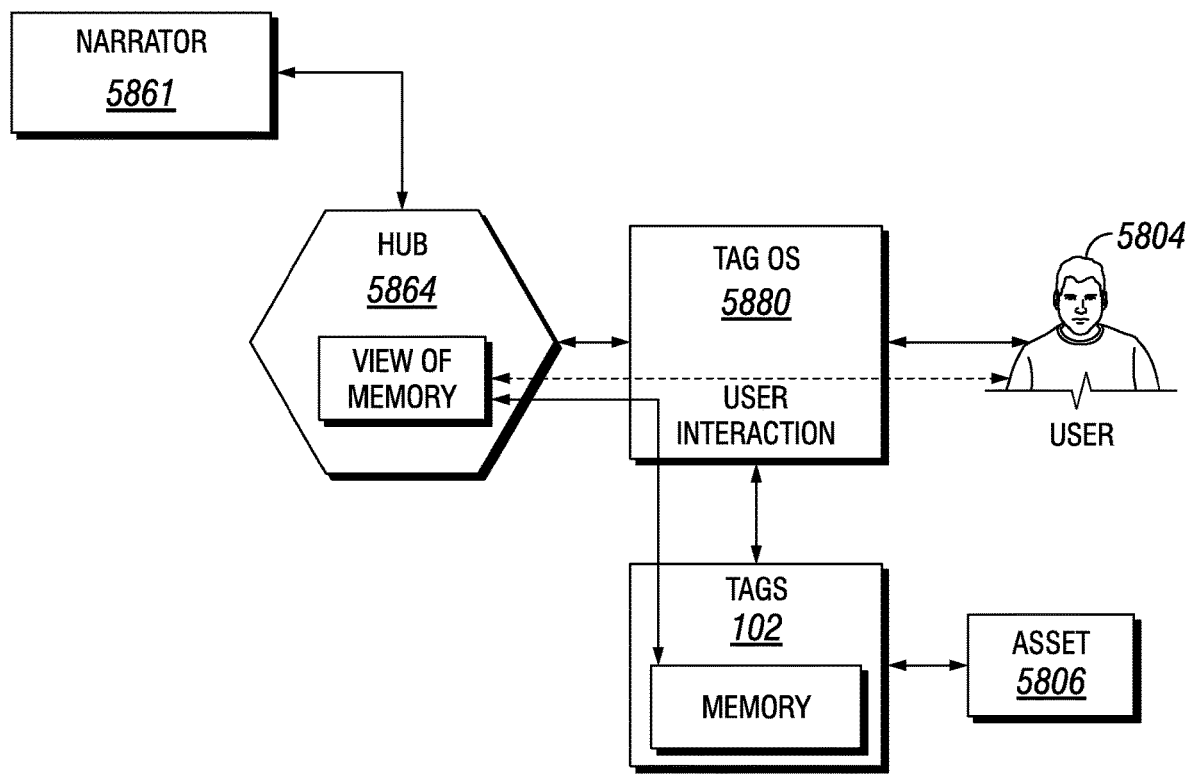
FIG. 2 illustrates an embodiment interaction between a user and tag data through hub facilities.

Reference applications 5860, such as the narrator 5861, may be closely linked with the tag operating system 5880, as the tag operating system 5861 enables various features that enable each asset tag 102 to tell a story about an asset 5806, its environment, its interactions with other assets 5806, or the like. In embodiments, the narrator 5861 may include capabilities for writing data in the hub 5864, such that the action of writing that data to one or more tags 102 may be completed later. For example, referring to FIG. 2, in the hub 5864 a user 5804 may see a view of the memory associated with an asset 5806 (such as on a tag 102 or embedded chip for the asset 5806), and the user 5804 can interact with files, such as through drag and dropping the files, to a selected memory area in that view, so that the system will execute the writing of those files to that memory area. This may occur whether or not the user 5804 is in current proximity to the tag 102; for example, the write may occur at a later point when a reader 140, gateway 138C, or the like comes into communication with the tag 102, without the user 5804 needing to be aware of the place or time at which the opportunity presents itself. The writing of data may be enabled in various platforms, with write actions handled by the asset intelligence platform. For example, users may work in C-sharp, ASP.net, Xamarin Forms, SQL Lite, or other platforms, and data integration capabilities of the asset intelligence platform can understand the write commands, perform necessary translations, and perform write actions to an asset when the opportunity presents itself.

In embodiments, the asset intelligence platform 5802 includes remote and/or back-up provisioning of assets, such as creating necessary licenses, allocating them to devices on which a narrator 5861 can be installed, and the like, each of which may be accomplished in the hub 5864. Provisioning may include providing settings (such as for various applications that may consume information stored on tags and for readers, gateways, or the like), define assets (such as defining asset types that are tagged), and the like.

Figure 3:
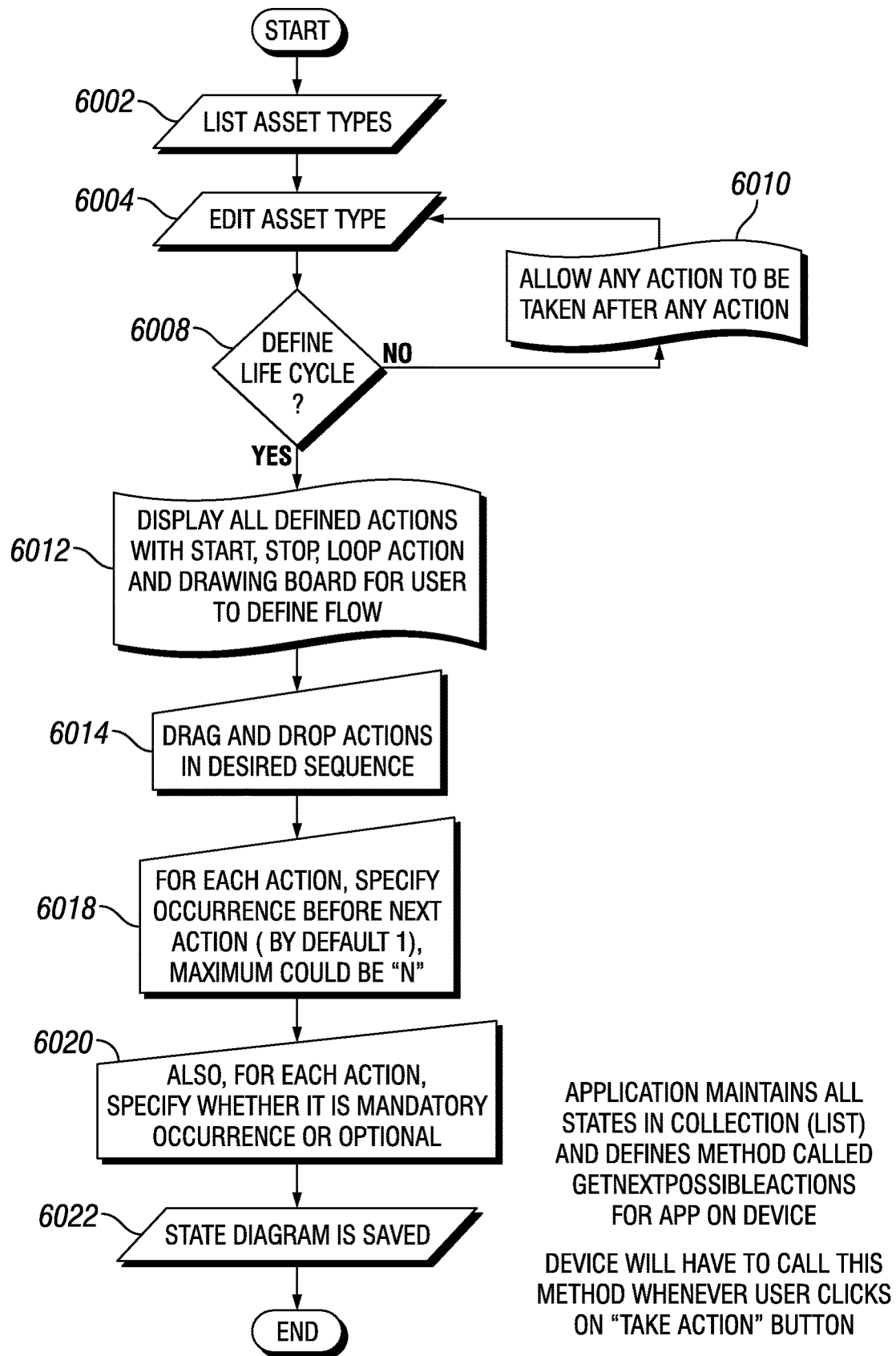
FIG. 3 depicts an embodiment of a flow for managing state information in an asset intelligence platform.

In embodiments, the asset intelligence platform 5802 may include a state engine 5862 that may read states and keep track of states, such as states relating to an asset 5806. For example, an asset 5806 that goes through a sterilization process could be tracked as having a "sterilized already" state and a "not-yet-sterilized" state, etc. States can be used to enable a wide range of uses, such as by providing state data as a service or flow (where users may learn unexpected things about their business based on patterns of state data). For example, marketing users may use state data to help sell products, product development users may use state data to help develop products, etc. Once states are defined for an asset 5806, the asset intelligence platform 5802 may include the ability to handle this state data through various systems as it passes through processes, events, or environments that may change the state. For example, various gateways 138C or readers 140 may be configured to automatically write appropriate state data or extract state data as the asset interacts with them. Once one has defined how the asset 5806 passes through the states, the asset intelligence platform 5802 can automatically take care of writing appropriate state information to the asset 5806 and take care of having relevant state information pulled from tags 102 for handling by other tags, readers, gateways, cloud platforms, or other elements of a deployment. In embodiments, there may be different readers 140, gateways 138C, or the like along the way as an asset 5806 changes state (such as the asset passing along an assembly line or through a supply chain), but the asset intelligence platform 5802 can automatically figure out what reader 140 should perform read and write operations based on the state of the asset and other factors, such as location. Thus, tags 102 can be used by multiple, heterogeneous readers 140, at the right place and time, based on state information for an asset or its environment. Referring to FIG. 3, an embodiment of a flow is provided for managing state information in an asset intelligence platform. At a step 6002, a list of asset types is initiated, which may, at any time, be edited in a step 6004. At a step 6008, a user may be prompted to define a life cycle for the asset, such as a sequence of states, or a flow, through which the asset is expected to progress. For example, for an asset like a beverage or a pharmaceutical container, the life cycle might include an empty or pre-filled state, where the container is waiting in inventory (such as at a bottling facility) to be filled, a sterilized state, such as after the container is sterilized, an initially filled state, where the container is filled, a sealed state, where the container is sealed or capped, and a delivered state, where the asset is delivered to a point of sale. The life cycle may thus define the sequence an asset is expected to experience, through a wide range of possible states. If no life cycle is defined, then the system may, at a step 6010, allow any action to be taken in any order, rather than constrain actions to follow the life cycle. If at the step 6008 the life cycle was defined, then at a step 6012 the system may display the defined set of states and/or associated actions on a drawing board, with a start step, an end step, and connectors that allow a user to define a flow through which the asset will move through various states. At a step 6014 a user may drag and drop actions into a desired sequence of the flow. At a step 6018 a user may specify, for each action or state, what should occur before the next action or state is reached. At a step 6020 a user may also specify, for each action, whether the occurrence of the action is mandatory or optional. At a step 6022, the state diagram may be stored and used by the asset intelligence platform as a basis for defining the states through which a given asset type should progress. In embodiments, the asset intelligence platform maintains all states in a collection and defines methods (such as called GetNextPossibleActions) for one or more applications, such as on a device that will use the platform. A device or application may be configured to call the method whenever a user indicates a desire to take an action (such as clicking a "take action" button) or an application indicates that a next action should be taken (such as in an automated process involving the asset).

Figure 4:
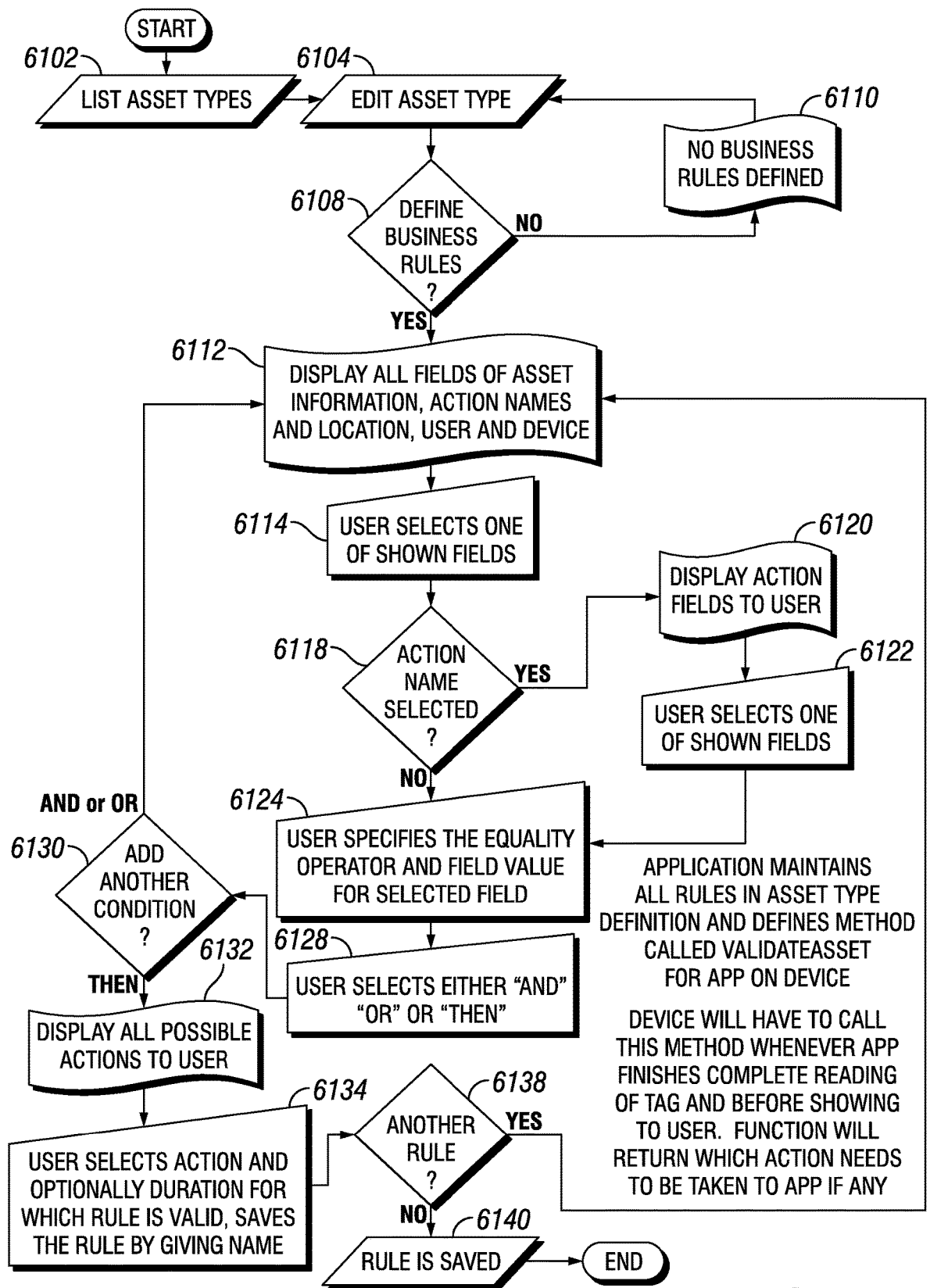
FIG. 4 depicts an embodiment of a flow for enabling a business rules engine.

Referring to FIG. 4, an embodiment of a flow is depicted for enabling a business rules engine that may be integrated into or used in connection with embodiments of the asset intelligence platform of the present disclosure. At a step 6102 a user may list asset types that the user (such as an enterprise), wishes to handle with the asset intelligence platform. At a step 6104, this may be edited at any time, such as to add or subtract assets, to change asset definitions, or the like. At a step 6108 a user determines whether to define a business rule. If not, then no rule is defined at a step 6110 and the user may continue to edit the asset type at the step 6104 until a need arises to define a business rule at the step 6108. If the user wishes to define a business rule at the step 6108, then at a step 6112, then the platform may display, in a user interface, all fields of information that may be relevant to defining a business rule, such as asset information, action names, asset location information, user information, device information, or the like. At a step 6114 a user may select at least one of the displayed fields. If, at a step 6118 it is determined that an action name is selected, then at a step 6120 the fields with respect to the named action are displayed, after which, at a step 6122, the user may select one of the displayed action fields. Next, at a step 6124 (which may operate on an action field selected at the step 6122 or another field selected at the step 6114), the user is prompted to specify an operator, such as the equality operator, and a field value related to the operator, for the selected field. Next, at a step 6128, a user may select an additional operator, such as an "AND," "OR," or "THEN" operator. If, at a step 6130, it is determined that another condition is to be added (such as when the "AND" or "OR" operator was entered at the step 6128, then processing returns to the steps of 6112 and 6114, where a user may select from the displayed fields of asset information, action names, locations, users and devices to specify additional operations on those in the subsequent steps of the flow. This cycle of selection of fields and specification of equality and other operators may iterate until at the step 6130 it is determined that additional conditions are not needed (such as when the "THEN" operator is selected at the step 6128. Next, at a step 6132 the platform may display all possible actions to the user. Then at a step 6134, the user may select an action, which may optionally include selecting a duration for which the rule is valid and may assign a name to the rule. Next, at a step 6138 a user indicates whether another rule is desired, in which case the flow returns to the step 6112 where all fields that are potentially relevant to rules are displayed and processing continues and iterates to generation and naming of additional rules until at the step 6138 no more rules are desired. At the point where no more rules are desired, the rule is saved at a step 6140. In embodiments, the platform may maintain all saved rules, such as associating them with the asset type definitions for the assets to which the rules relate. A method may be defined, such as called "Validate- Asset" that can be called by an application or device that uses the platform. A device or application may call such a method whenever the application interacts with an asset type to which a rule relates, such as when a reader device or application read information from an asset tag or other RF device. The stored rule may then be applied to determine which action needs to be taken by the device or application, such as reading certain fields of information, writing information, undertaking processing steps, translating information, passing information to another rule, and many others. Through such a flow, a wide variety of rules may be defined for handling assets and information about assets.

The asset intelligence platform 5802 can manage a diversity of tag 102 types within the same environment, such as tags produced by different companies, tags implementing different identification schemes, tags with different memory capacities, and the like. For instance, tag memories vary greatly from those comprising memories for only an EPC code to those with high capacity memory 162 for storing asset data sets as described herein. In an example, a user may manage assets that are tagged for a variety of purposes, from simple ID detection to storing elaborate asset histories and tracking information, where the user has purchased tags from a variety of different vendors. The asset intelligence platform 5802 may provide data handling and user interfaces that enable the user 5804 to seamlessly manage data from such diverse tags in a way the presents data from deployed assets as a cohesive whole, managing data from diverse tags through the user interface 5882 in a manner that is transparent to the user 5804.

The asset intelligence platform 5802 may enable the user to search and filter through the diversity of tags 102, readers 140, content data stored on tags, and the like, as part of user interface 5882 functionalities, enabling a user 5804 to search and filter by a variety of parameters (e.g., tag type, memory type, content of stored data, asset type, tracking parameter, history parameter, proximity [e.g., via RSSI], EPC, TID) and Boolean functions (AND, OR, NOR). Centralized searching and filtering functions provide the user 5804 with a powerful resource in managing a large tagged asset deployment.

As described herein, a great variety of data types may be stored on tags 102, especially tags with high-capacity memory 162. Data stored on the tagged asset may include specific information about the asset (e.g., photograph of the asset; history of the asset; location tracking information of the asset; files, links, URL, object feature of the asset; data objects), information about readers interfacing with the tag, inspections of the asset, and the like. The user interface 5882 may enable a graphical interface that allows the user 5804 to drag and drop content onto a tag for storage of that information onto the tag. For instance, an image computer file associated with the asset could be dragged and dropped on the asset tag and be transferred through the asset intelligence platform 5802 onto the tag, such with applied error correction, compression, security, and encryption techniques to the stored file. Photographs could for instance provide a photograph of the asset, proof of repairs or inspections, an image of the environment local to the asset, and the like. Objects may be saved and loaded onto a tag, such as comprising reader settings, application configuration information, requirements data, metadata (e.g., for ETL requirements), business objects, data records, location record, and the like. Business objects may be stored on a tag, such as containing service information, version information, and the like. For instance, the stored data could provide configuration information for the asset, what information is to be gathered, what information is to be stored locally on the device, location information (e.g., locations of asset installations). The asset intelligence platform 5802 provides a central place to define and store this asset information in a manner that is manageable, searchable, and configurable by the user, and the system is able to configure and integrate that information into the user's work process, such as integrating the business object and content information into a workflow.

In embodiments, devices 5840 may be simulated through a device simulator facility 5843, including deployment of tags 102, interrogators and readers 140, communication infrastructure (e.g., network pathways, servers, gateways, controllers), tag database structures, sensors 138A, and the like. A user 5804 (e.g., ranging from a small-scale user to a large-scale enterprise) may want to simulate the deployment of tag resources in association with tagging assets 5806 prior to the actual physical deployment. Through use of the device simulator 5843 the user 5804 may be able to simulate a tagged asset environment to evaluate tag access efficiency, data communication pathway timing and capacity, memory management, database structure boundaries and effectiveness, tag identifier database management, and the like. The device simulator 5843 may be hosted by the tag operating system 5880 and simulate all or a portion of a tagged asset environment, and optionally include simulated data exchanges with tags, simulation of remote applications working as servers (e.g., for listening to specific ports for messages), viewing simulator reader settings, updating simulator reader settings, acquiring lists of tags in a population or database, creating new tags, viewing content of an existing tag, deleting tags, relocating tags (e.g., tags out of range of the reader), associating tags with different assets, and the like. The device simulator may simulate updates of content to a tag, such as update of an EPC, user memory, passwords, and the like. The device simulator may further include a variety of applications that enable the simulation of commercial readers, such as a fixed or mobile reader, TSL USB and Bluetooth readers, and others. Test tools for performance optimization and regression testing may be provided. In embodiments, features of the device simulator facilities 5843 may further include tag data formats, including a standardized EPC framework including UDI SGTIN; § ISO 15962; Optimized DPFS+ format and planned error detection and correction. In embodiments, features of the device simulator may further include UDI (and other EPC/ISO app) birth station applications; fast tag data query applications, e.g. search for expired tags; RFID drive applications, fixed and mobile, as described herein.

The device simulator 5843 enables a user 5804 to manage deployment of tags 102 and associated computer system infrastructure prior to or off-line from the deployment of the actual physical tags 102 and infrastructure. The device simulator 5843 enables a software simulation and end-to-end solution prior to deployment. For example, prior to deployment a user 5804 may set up the tag data (e.g., EPCs, number of tags, groups of tags), reader settings and configurations, communication pathways, database structures, and the like, and run simulations to test and verify the tagged asset environment is configured as desired. At the time of deployment, the narrator 5861 and hub 5864 may provide support for both simulation, handover, and deployment, as well as verification of deployment performance to simulated performance. At the time of deployment, the device simulator 5843 may then replace simulated tags with real tags (e.g., with the exact same EPCs so the simulated tag becomes the real tag), simulated readers with real readers, and simulated computer infrastructure and database structures with real ones. The overall flow of simulation may progress from initial testing and demonstrations, to full system simulation, to deployment of hardware and software.

At the tag 102 level, the device simulator 5843 may simulate the tags memory, memory structure, firmware, software, access speed and timing, and the like. The device simulator 5843 may support filtering of tags based on received signal strength indication (RSSI) (e.g., proximity), tag memory, electronic product code (EPC), tag identifier (TID) memory, programmability of tags, and the like. At a next higher level the device simulator 5843 may simulate performance and memory structures associated with groups of tags 102, such as grouped by asset, managed as a database of content, and the like. At a next higher level the device simulator 5843 may simulate interrogators and readers, such as in their settings, data collection algorithms, groupings, performance, connectivity with tags and supporting computer infrastructure, and the like. At the highest level the device simulator 5843 may simulate computer system infrastructure, such as including network, storage, and user interface simulations. In embodiments, the user may build a simulation environment for use with the device simulator through software library 5883 modules, enabling an efficient process for building and executing simulations.

In embodiments, the asset intelligence platform 5802 may provide for support of a hybrid simulation environment that combines both real and simulated devices 5840. In a hybrid simulation environment, the user may maintain access and management of real devices (e.g., readers and tags) simultaneously with the simulation of devices. This capability enables a user to simulate the impact of introducing new simulated devices on an existing real asset environment before introducing the actual physical devices, thus reducing the risk associated with the introduction of those new resources. For example, the capability for hybrid simulation may allow a user to implement a physical deployment of tagged assets in stages, simulating and releasing a first stage, then simultaneously simulating a second stage in conjunction with the released first stage, and so on. Large deployments may then be managed in a staged implementation.

Embodiments of the present disclosure include a tag operating system 5880 that enables the use of read/write strategies for data on a tag 102, including capabilities for querying a tag as a database. The platform may, in embodiments, define a database user interface 5841 for querying a tag, wherein a user 5804 can configure queries for data on one or more tags 102 using conventional database query types, and the platform may include a query translation component for translating queries into a plurality of commands, such as commands for reading one or more tags to retrieve relevant data that responds to the queries. For example, a user may form a Boolean or natural language database query that is intended to retrieve all instances of data on an asset tag where the data indicates the tag was read at a given location, such as a warehouse, and the query may be translated to command a reader 140 to retrieve data from a tag 102 and filter the results to provide the requested data.

Embodiments of the present disclosure include a tag operating system 5880 that enables the use of read/write strategies including writing to a tag 102 as a database. The platform may, in embodiments, define a database user interface 5841 for writing to a tag 102, such that write commands for data (including ones that extract, transform, and load data to a database), written in conventional database languages or entered in conventional database user interfaces are parsed by a database command translation component and translated into a series of write commands for writing the data on an asset tag, such as using command structures employed by asset tag readers, gateways, and the like. For example, a user may prepare a database command that daily ambient temperature data be extracted (such as from a defined data stream for a given location) and written to all tags at that location, and the system will automatically pull the temperature data and configure commands for readers, gateways, or the like to write the temperature data to the asset tags that are at the location (such as determined by GPS data on the reader, gateway, or tag, or based on location information stored on any of the above, such as in an asset location map).

Embodiments of the present disclosure include a tag operating system 5880 that enables the use of read/write strategies including writing to a plurality of tags 102 as a database. The read/write strategies noted above can include treating a plurality of tags 102 as a database, such as by defining data storage locations across the plurality of tags 102, with pointers, that indicate what data storage elements should correspond to what tags 102 (and including defining what data storage elements may be used for redundancy, back-up, failover, data movement operations, and the like). Thus, a set of one hundred tags may be treated as a unified database, with the one hundred tags configured to correspond to defined memory locations in a database, effectively allowing them to handle larger read and write operations than are possible given memory limitations of a single tag. This may be of particular use for situations where many tags are associated with assets that share a common use, such as a large group of tags that reside on the same asset 5806 (e.g., a collection of seat tags on an aircraft, a collection of component tags on a mechanical system, like an engine, a collection of tags on high volume inventory items (such as units of foods, pharmaceuticals and consumer packaged goods), and the like). The user 5804 does not require expertise, or even knowledge, of the underlying data structures, capacities, or requirements of the tags 102 and can simply continue to operate in the user's conventional workflow, with the tags 102 behaving just like any database with which the user is accustomed. In embodiments, the collection of tags 102 may be supplemented by additional tags, effectively increasing the size of the database by providing additional memory locations. Initial and added tags may be tracked and provisioned, including tracking relevant correspondence between tag memory locations and database pointers, in a hub or similar facility of the platform, so that adding tags is seen by end users as an upgrade in database capacity. Thus, embodiments of the present disclosure include a tag operating system 5880 that enables the use of read/write strategies including maintaining pointers to memory locations in one or more tags (e.g., in metadata) so that the tag 102 can be written to and queried by a database interface.

In embodiments, multiple tags 102 may appear on one asset and a user can manage them all as one set of tags or one unified data structure. This capability leverages memory mapping across the multiple tags 102, including through use of metadata, such as stored in a hub 5864 of the platform. Data structures across the tags 102 may be managed using a variety of database techniques for maintaining data quality or improving performance, such as RAIDS (including capability for parity checking) or RAID0 (such as for improving read and/or write speed). In embodiments, a storage space across multiple tags 102 may be parity protected, so that a user can lose some tags 102 or memory locations and still have the full database.

In embodiments, users may wish to store a large set of documents that may be relevant to a collection of tags 102.

Such documents may be stored across tags 102 in a fashion that facilitates efficient searching and retrieval, such as a linked list, where one or more tags may store a document or portions and links to other documents or portions, so that the documents can be reassembled via the links, including in response to database queries.

In embodiments, handling a set of tags 102 as a database may use multi-node tags, including having multiple nodes that use a common antenna. By providing multiple chips on a single tag, or multiple tags on a single asset, storage and retrieval may be optimized for reliability and/or performance (such as input/output speed, energy usage, or the like). In embodiments, capacitance of a chip may be used as a driver (e.g., the powering agent) for another chip, which may serve as a functioning agent, while another chip may act as a response agent. The power for a tag 102 can go through those various elements. This allows various parallel and serial configurations of operations (such as accepting queries, doing calculations, and sending responses) in ways that are coordinated and optimized based on the capabilities of individual nodes on the tag.

Embodiments may include embedding knowledge in each node about other nodes. For example, one or more nodes may store enough knowledge to redirect a query to another appropriate node, such as one that has data, or to redirect a response to another node that needs the data.

In embodiments, redundancy can be provided at multiple levels, such as having redundancy at the software level (such as in the hub) and at the hardware level (such as by having redundant memory on a single tag (e.g., across two nodes of a multi-node tag) or across tags. A directory (stored on tags or in the asset platform) may be used to identify available locations of redundant (e.g., back-up or recovery) data at the tag level and the asset platform level.

In embodiments, the asset intelligence platform 5802 may be configured to work with a wide variety of readers 140, printers, and other associated devices, such as by employing appropriate device drivers 5842 and data integration features, that allow the asset intelligence platform 5802 to initiate reader functions, such as searching, reading, writing, and locking data. The asset intelligence platform 5802 may include device drivers 5842 and/or data integration capabilities for operating with, for example, readers and gateways provided by Motorola™, ThingMagic™, Impinj™ Zebra™, and others, as well as LLRP-based readers and TSL readers. Support for additional readers may be embedded in the asset intelligence platform over time, allowing handling of a given asset by multiple readers, such as ones deployed in various environments in which the asset resides.

Embodiments of the present disclosure may include a tag operating system 5880 that includes a set of tag drivers 5842 for asset tags 102. Historically, a wide variety of readers 140 have proliferated for reading tags such as RFID tags, with each reader 140 having unique characteristics that users needed to know in order to read a set of tags. The asset intelligence platform 5802 may allow for uniform interactions with various kinds of tags 102 and readers 140, without the user needing to know about the unique characteristics of the tags or the readers. For example, some readers 140 support multi-step commands, while others only allow single-step commands. The asset intelligence platform 5802 may automatically translate multi-step commands into an appropriate set of single-step commands and execute them in appropriate sequence and timing, so that the user does not need to understand what readers 140 will be used. Whether a reader 140 supports multi-step commands or not, the platform takes care of sequencing for multi-command work flows and searches, even with readers that are not conventionally set up for that. For example, a user accustomed to working in a conventional database programming environment like SQL™ can set up SQL commands (e.g., various AND/OR combinations) to interact correctly with a set of tags 102 (such as to find the right tag based on search criteria or write to the correct tag), regardless of whether a reader 140 is configured to handle such commands. By handling translating conventional database commands to the appropriate commands that drive heterogeneous readers, the asset intelligence platform 5802 vastly simplifies the process for end users who want to engage with ID tags or IoT assets. Each of the capabilities for translating commands to appropriate commands for a given reader, gateway, or the like is referred to in some cases herein as a device driver 5842 for that reader. Thus, in embodiments, provided herein is a set of device drivers 5842 that allow querying and writing to IoT devices, including asset tags 102. The asset intelligence platform 5802 may include a driver or set of command translation elements to connects to every reader, gateway, or other typical communication device used in asset deployments. The asset intelligence platform 5802 may access and interact with underlying device drivers 140 and libraries that belong to a particular reader 140, gateway or the like. For example, if a reader 140 has a proprietary device driver 5842, the asset intelligence platform 5802 may be configured to use that device driver 5842 when interacting with that reader 140. Thus, the asset intelligence platform 5802 brings all of the standard components in a single place and pulls in the proprietary components as needed. Making heterogeneous readers 140 work together is something needed in virtually every asset environment. It is a real challenge that reader companies have installed readers in various environments, and it can be hard to change readers that have been installed in processes or environments. The asset intelligence platform 5802 may, by virtue of translating commands, use this existing infrastructure without requiring users to become experts on all kinds of readers 140. Users can work with a simplified, standardized set of commands, such as ones used for other activities, such as interacting with databases or files.

The ability to distribute and handle data across multiple tags or memory locations of tags enables a range of other capabilities of an asset intelligence platform. For example, as noted above, IT infrastructure complexity and expense is a challenge in asset management situations that require a centralized database. In embodiments, even in cases where some centralization of asset data is useful, the infrastructure deployment can be dramatically reduced and require much less involvement from information technology departments when it is combined with a distributed-data, smart asset approach as enabled by the asset intelligence platform described herein. Identification-based solutions may have an "always on" nature to the endpoints; for example, data often must be transferred at specific times or operations cannot proceed. By adding distributed data, a useful amount of fault tolerance is added that greatly simplifies system design; moreover, the distributed information may reduce the number of parties that need access to the central database, simplifying the handling of authentication and similar procedures in managing the database. For example, data could be transferred to a cloud only at the start and finish of a lengthy supply chain, and done so by database owner. Interim data could be added to the smart asset alone, and optionally done by outsiders without the need for elaborate security protocols. The result is a vastly simpler, cheaper, more secure solution that can also have increased functionality. As noted above, a need exists for asset management solutions with simplified communications, and embodiments of the present disclosure include methods and systems for simplifying communications about assets with various constituencies and stakeholders. Since smart assets can store a significant amount of data locally, they become their own example of movable storage. As with any other form of movable storage, this opens up a channel for communications. By storing lifecycle data on components to facilitate downstream maintenance efforts, anyone who writes data onto the asset effectively sends a message to other players in the supply and use chain. For example, when a retailer adds information to a loyalty card about a purchase, it is a message to the next retailer about the opportunity to sell complementary goods and services. Communication occurs over time via the stored information that accumulates on the asset. In embodiments, a defined record, such as the Scratchpad Record of the ATA standard, may be defined for the purpose of communication. The Scratchpad Record is an electronic "sticky note" stored on the asset that is effectively addressed to the next party that accesses the asset (e.g., "the next mechanic that services this part"). A message (such as "repaired a leak but should be kept an eye on") can be very useful to the next party, whose identity may not even be known at the time data is stored. The as-yet-unknown party can receive the message and make use of it at some point in the future.

In embodiments, a wide range of parties may scan assets and receive communications from the past users of the asset, such as to communicate asset details from manufacturers, installers, and other parties to all potential users, without the complexity of setting up a website or a centralized database and without relying on networks and other infrastructure.

In embodiments, issues with absent or intermittent network connectivity may be addressed by the present solution. In embodiments, an intelligent asset platform may store data locally so that operations can always proceed without interruption, notwithstanding the absence of network connectivity. Smart synchronization may move data into a cloud or server whenever a network connection is available, which allows for higher-level visibility and dash boarding, but without interrupting operations.

As noted above, embodiments of the present disclosure include methods and systems of an asset management platform that allow rapid operations regardless of the speed or capacity of available network operations. In a system based on smart assets, there is enough data stored directly on the asset that decisions can be made locally, without referring to cloud or server data. These decisions can be made automatically, under control of a computer that operates on data retrieved from an asset or manually by the people interacting with information retrieved from the asset. In embodiments, decisions can be made automatically by machines that can perform basic analytics and run rules engines, as described elsewhere in this disclosure, to decide on and initiate future actions.

As noted above, embodiments of the present disclosure include methods and systems for sharing of information while preserving confidentiality. The asset intelligence platform disclosed herein, provides a compelling solution to the problem of confidentiality. Relevant data is stored directly on an asset, and the data stored is only that associated with that one asset. Additional data is added during significant events, and can be added by anyone in the supply and use chain. The result is access to a rich dataset on the asset being looked at, without the need for any organization to provide access to other data repositories, such as internal databases. A user can share information freely with respect to one asset, but consequences of a data breach or attack are limited to that single asset, dramatically reducing the risk of sharing information about that asset with a third party. Essentially, a user may be willing to share their data concerning this one asset, but not willing to provide lookup access to a larger database due to the risk that the entire database could be exposed, either inadvertently or through malicious intent. Isolation of data access to the relevant access provides a powerful solution to this problem.

As noted above, embodiments of the present disclosure include methods and systems for asset intelligence that avoid the need for a centralized database. When possible, an asset intelligence solution may be deployed that does not create a central database. In such embodiments, the database may be distributed across many (e.g., millions) of distributed endpoints, such that even a successful hack of an asset can only uncover data on one or possibly a handful of assets, rather than uncovering data for a large number of parts, or uncovering critical enterprise data. In embodiments, data can be distributed in partial fashion, such as described in embodiments disclosed herein, such that even upon hacking it is difficult to determine the meaning of the data, such as where records or partial records are distributed across multiple tags with pointers to the memory locations of those tags (and to the relevance of the stored information), being stored elsewhere, such as other tags or in a central location that stores pointers, metadata, or the like, but not actual memory, for the tags.

As noted elsewhere in this disclosure, embodiments of an intelligent asset platform are disclosed that include methods and systems for providing asset authentication. In embodiments, a distributed memory approach, with storage of information on the asset, takes advantage of the additional storage capability on the asset to employ authentication schemes that are mathematically secure. For example, a globally unique tag ID number may be stored on a tag or other chip during manufacturing that is written to a memory location that can never be modified. The tag ID number (TID) and other data (such as the manufacturer's Electronic Product Code (EPC) number for an item of equipment or other asset) may be read from a tag, then signed using a private key that corresponds to a defined public key, with the resulting data being written back to the tag. Anyone with the corresponding public key can de-crypt the data signed by the private key and use the tag ID number and other number to verify that the asset (or other data) is authentic. If another party attempts to create its own tag by copying a signature from another tag, the new value will not match the EPC+TID numbers, since the other party did not have the private key. It is also possible to use randomly generated private keys or similar mechanisms, as long as the EPC-PublicKey pairs are kept track of. The possibility of copying the entire EPC+TID+signature triplet into another tag type (such as one where a memory location can be re-written) can be eliminated by using techniques that determine that the chip was manufactured by a particular manufacturer, such as techniques that inspect the data architecture or other capabilities of the tag type or by other techniques which rely on a physically uncloneable function (PUF).

Tags 102 may interface directly with a variety of facilities as described herein, including with sensors 138A and gateways 138C. Sensors 138A may provide vital information associated with an asset, and a gateway associated with a tag 102 interfacing with a sensor 138A may provide an independent data path for the tag operating system 5880 to acquire the sensor data. With this capability, sensors may be able to interface directly to a computing device other than a reader. For instance, through the gateway 138C a user could read sensor data through a smart phone, where sensor data is collected and transferred through the gateway 138C to the smart phone. In another embodiment, the gateway could be connected to a network, and the asset intelligence platform 8502 could then collect the sensor information through that interface as an alternate to reading data through a reader 140, such as to transfer data at a higher speed, to provide data when a reader 140 is not available, and the like.

Tags 102 may have multiple antennas 108 as described herein, where the multiple antennas 108 may be used for improved read-write capabilities. One such capability may be utilizing different antennas for different functions, such as interfaced through software tools associated with the asset intelligence platform 5802. For instance, one antenna of a tag could be used for a primary read-write functions and a second antenna used for a secondary status function. This way the tag could have primary functions handled by a first reader assigned to those functions (e.g. a fixed reader performing regular processes) and a second reader accessing the tag on a more transient basis (e.g., a mobile reader performing non-scheduled status checks). The asset intelligence platform 5802 may provide software facilities for managing multiple-antenna accesses and functionality, such as where the user 5804 can develop custom interface procedures and processes for interfacing with tags 102 with multiple-antennas.

The tag operating system 5880 and asset intelligence platform 5802 integrates a range of major functions 5820 and distributed data management 5830, including Local Intelligence Storage 5821, Multi-Level Error Correction facilities 5822, Real-Time Response facilities 5823, Object Loading facilities 5824, Threading facilities 5825, Password Management facilities 5826, Reconfiguration from Hub facilities 5827, Hybrid records and Files facilities 5828, Compression facilities 5829, Keys and Block Chain facilities 5830, Data Integration facilities 5831, Caching facilities 5832, Chunking Reads-Writes facilities, Downtime Data Handling facilities 5834, and Pluggable Data Standards 5835, Asset Monitoring and Management, Remote Provisioning and Deployment, Device Simulators 5843, Device Drivers 5842, Asset Data Organization facilities 5844, Database Interface facilities 5841 for tag data, and the like.

The asset intelligence platform may be used to support data integration activities, such as involving the extraction, transformation and loading of data. For example, a set of tags or memory locations on tags may act as a source of data that can be extracted using the asset intelligence platform and either transformed by the asset intelligence platform itself or loaded to a target location outside the asset intelligence platform, such as a cloud platform, an IOT platform, an enterprise database, or another location where the data can be accessed or further transformed. Data from the tags or memory locations can thus be integrated into a wide range of solutions, including being integrated into hybrid data structures that include data from the assets, such as electronic health records, MRO records, records relating to enterprise functions (such as human resources databases, sales databases, financial databases, and many others), and a wide range of other data structures used to support many different operational processes, including ones enabled by or enabling the Internet of Things. Similarly, one or more tags or memory locations distributed across tags may comprise target locations for storage of data that is extracted from external data systems (such as any of the foregoing), transformed or processed by such systems or by the asset intelligence platform, and loaded onto the tags or memory locations, including in embodiments where a collection of memory locations or tags operate in a coordinated way, such as where they can be handled as a database, as described in embodiments of this disclosure.

The asset intelligence platform 5802 may provide caching of tag memory as a feature of distributed data management, such as for storing content to be stored on one or more tags, or which has been read from one or more tags. Caching of tag memory may be provided for a single tag, multiple tags, a database structure of tags, and the like. Caching of tag memory may be provided to allow faster access to data previously written to tags than is ordinarily achievable within the capabilities of the tag communication mechanisms. For example, a block of data may need to be written to several tags attached to different assets, but where all the tags are not necessarily accessible at one time. In this instance, the block of data may be cached, and that data then written to each tag as they become accessible. Caching thus enables an efficient vehicle for writing data to multiple tags of differing accessibility. Caching of data may also be used when there is standard data that needs to be written to many tags, or is the default for a category of tags. In this instance, caching enables an efficient way to quickly distribute data to tags as they become available. In another instance, caching may be used when data is transferred from tag to tag, or from one tag to many tags, especially when the destination tags are not all available for access at the same time (e.g., when some tags are attached to a mobile asset).

The asset intelligence platform 5802 may provide chunking of large blocks of tag memory for reads and writes as a feature of distributed data management, where the capability for the asset intelligence platform 5802 to handle the chunking of large blocks of data may provide improved efficiency in the transfer of this data across network resources, storage of the data on reader devices 140 prior to writing to a tag 102, transfer of data from a reader device to a tag or number of tags, and the like. For instance, chunking may optimize data transfer between a reader 140 and a tag 102, automatically chunking data to what the reader and tag and handle. Additionally, chunking may be applied across many tags within the same operation, avoiding the overheads associated with one on one communication.

As the platform can operate with distributed data, local data can be used where access to a network is not available, such as in a hybrid online/offline operational mode of the asset intelligence platform 5802, where changes to local data can be propagated to a network when such connection resumes. This makes the platform useful in applications where downtime is incurred, for example when telecoms infrastructure is in outage following an adverse weather event, when an enterprise asset deployment constitutes times and/or places where network connectivity is intermittent, and the like. Because data can be stored directly on an asset, a user has the capability to manage information about the asset in a disconnected mode (e.g., off-line from a network) when necessary, where there is no requirement to retrieve or store information to the cloud at all times. For instance, a user may be local to a tagged asset and want to access or update information on the tag 102 through the asset intelligence platform 5802, but a network connection is not available. The user may be able to manage the asset information whether connected to the network or not, because the information is stored directly with the asset, and not up on the cloud. In this way, the user is able to manage the data locally (e.g., utilizing the user interface 5882 of the asset intelligence platform 5802), directly with the asset, even when the user, reader 140, tag 102, and/or the local system, is disconnected from the network. Once network connectivity is re-established, changes to the data on the asset can be exchanged/synchronized within the networked resources of the asset intelligence platform 5802. In an example, the tagged asset may be traveling through a supply chain, where network access is intermittent, but where a user is still able to update information with the asset 'on the road' through a user interface 5882 operating in an off-line mode with the confidence that the update will be exchanged with the networked facilities of the asset intelligence platform 5802 when network connections become available. In another example, the asset may be part of a mobile platform (e.g., vehicle, airplane, and the like), where network connectivity is inherently discontinuous, but where off-line updates and network-accessed data exchanges are constantly occurring as a matter of course. With the asset intelligence platform 5802, the user may maintain local and/or remote access to the latest available asset data whether connected to the network or not, and where the asset data is consistently exchanged/synchronized with the networked facilities of the asset intelligence platform 5802, as a network connection becomes available.

Although the proprietary protocol described herein as DPFS+ is designed to accommodate data of any type, many standard mechanisms for storing data present the data in similar manners, for example, as collections of name-value pairs. The platform is architected in terms of abstractions and interfaces such that the data standards are implemented in a manner which is interchangeable across any data presentation where the functionality is logically consistent. So if one industry represents its data in one manner using one terminology, and another industry represents it in another, then the two industries are able to use the same application to perform applications which are industry-wide, for example, maintenance, quality control, through-life asset optimization, with each industry just needing to plug in its own unique data standard.

Local Intelligence Storage 5821 includes the ability to embed data and documents on the asset 5806 itself. A single common interface to any RF gateway device enables the user to store anything to the smart asset—be it a file, a link to a file, an image, a URL, an object, a database record or any other data. Security, compression and error correction are available out of the box in the platform.

Asset monitoring and management enables local data management and message-processing capabilities, including a rules engine to manage and take action on the data. Users may sync local data from smart assets to the cloud to build and view reports. Data integration capabilities facilitate use of distributed data from smart assets, making data of heterogeneous types available to any cloud-based Internet of Things (IoT) platform or core enterprise systems such as Enterprise Asset Management (EAM), Enterprise Resource Planning (ERP) and Business Intelligence (BI) and analytics applications. Remote provision and deployment across large numbers of assets are enabled, empowering administrators with, in embodiments, a browser-based platform to define smart asset types using standard or custom data structures. Users can Quickly provision and manage smart asset deployments. The asset management platform supports pluggable data standards, allowing a user to specify what data standard the user wishes to use with a smart asset solution, including UDI, GS1, ATA, Spec. 2000, Ch 9-5 and various others. Simulation features allow users to simulate a smart asset solution end-to-end before actual deployment. In embodiments, assets handled by the platform may include tags (such as RFID tags in various embodiments, including high memory tags, radiation-resistant tags, and other tags noted throughout this disclosure and in the documents incorporated herein by reference), chips (which may be embedded in or on assets) and other wireless devices that allow communication among assets, with assets, or about assets. Assets may be surrounded by other assets or supporting elements, such as gateways, sensors of all types, and the like, which may facilitate production of information about the asset or its environment (which may be stored on a tag, chip, or the like that is disposed in, on, or near the asset) and facilitate communication between the asset and remote systems, such as cloud IoT platforms, enterprise systems, or the like.

In embodiments, the asset intelligence platform 5802 may be deployed to multiple, heterogeneous clouds, such as an Azure™ cloud, an Amazon™ cloud and a Google™ cloud, with appropriate data integration capabilities, business logic and user interface elements to allow users of each cloud to work in their preferred native environments while seeing assets and the information stored on them as conventional storage elements, such as viewing the assets as a database, a set of files, or a set of objects (e.g., images, documents, .pdfs or the like).

In embodiments, error correction may be performed at multiple levels 5822 in the asset intelligence platform 5802. In the software library 5883 described elsewhere herein, error correction may be provided. For example, the software library 5883 can be used to develop an application for an asset deployment to write, read and check, perform multiple writes, and the like. Thus, the software library 5883 provides some error correction out of the box for a given application. In embodiments Reed-Solomon or similar approaches may be used for error correction, including at the level of the reader and at the level of the asset or tag itself. Error correction provides implicit error detection, and this provides a mechanism for ensuring the integrity of the data where the possibility of errors may occur for example in extreme environments.

Where data is not available at the tag, the platform may use the electronic product code as a locator for information which is located and accessed via a network or cloud system. This can make it challenging to ensure a timely response as the time for the data to be available can be unpredictable and subject to latency delays and routing issues. The use of an asset intelligence platform is able to use the local availability of data to ensure a real-time response which can ensure that action can be taken within the available time-window, for example by triggering a conveyer diverter when a recalled item is detected.

Traditional practice is that all data fields and their storage logic are exactly defined in a standard document, which prescribes exact protocols for how and where the data is stored, necessitating a prolonged specification process followed by a complex implementation process. In contrast, the platform described herein is able to interact with data of an unknown type, especially when using the DPFS+ data format, whereby the data can be presented as a software 'object', a file or even a database record (whether SQL or NoSL based). This takes the implementation complexity to a much higher and simpler level of abstraction and also ensures the maximum ability to interact with existing software without requiring special conversion or interfacing techniques.

In embodiments, the asset intelligence platform 5802 may utilize threading in the execution of control and management programming and algorithms to increase efficiency in execution, and where various levels of thread safety may be provided to guarantee the shared use of resources in the execution of asset management. For instance, synchronous and asynchronous safety processes associated with threading may be implemented to ensure that command sequences related to data reads and writes to tag database structures do not corrupt the stored data, such as when multiple resources or agents simultaneously access the stored data in the array of tag data storage areas.

Embodiments of the present disclosure may include a tag operating system 5880 configured to work with hardware capabilities that enable management of multiple passwords 5826, such as defining private and public areas of a tag or chip that are accessed with different passwords. In embodiments, there can be two, or more than two these. Memory management may thus be enabled at the hardware level for a tag or chip, such as using a public key protocol for a public part and a private encryption protocol or other protocol for access to one or more private parts.

In embodiments, the tag operating system 5880 may be aware of and take advantage of hardware features that are unique to a certain class of tag or chip. For example, high memory chips, chips that have memory segments (such as to enable separate passwords), chips that have memory segments that are separated for read and write, chips that are radiation resistant, and the like, can be understood by the platform, such that additional capabilities may be used with such chips or tags in the platform. For example, users can take advantage of hierarchical security, group security, and similar features by using different memory elements of a tag, such as having some users in an enterprise read public information, while only allowing certain other users to access private information. Thus, the asset intelligence platform 5820 may provide file security and access features, such as rights management, at the end user level, while leveraging hardware capabilities of a given tag.

The information hub 5864 handles information for assets 5806, and in embodiments may enable the reconfiguration of tag functions and capabilities, such as reconfiguring a tag memory (e.g., re-allocating memory to different data collection processes), a tag sensor collection configuration, an asset assignment, a status reporting content, and the like. Through the information hub 5864, the tag may be reconfigured to change the requirements of the tag's data collection scheme, including the extent to which the tag operates autonomously. For instance, a tag may be initially designated to collect data from a first sensor upon command from an interrogation event, but then be subsequently reconfigured to collect data periodically without commanding to do so. In addition, the tag could be reconfigured to collect data periodically from a second or third sensor, and become more autonomous and collect more data than originally configured. For example, a tag may be originally mounted to a car, under the hood, to perform a single function, the collection of data from a moisture sensor. However, the tag may also be connected to other sensors, such as where the tag-sensor assembly is a standard device equipped with several sensors. After the initial deployment of this single-use tag the user may decide to expand the function of the tag. Through the information hub 5864, the user then reconfigures the tag-sensor assembly to collect additional sensor data, such as from a temperature sensor. In addition, the user may reconfigure the memory allocation on the tag, alter the status data packet from the tag to include data from both the moisture and temperature sensor, and configure the collection sequence for each sensor. The user may reconfigure the tag to changing data requirements and applications. A user may be located remotely from the tag that is being reconfigured through the information hub 5864, or be in proximity to the tag. For instance, in the automotive example, the user may be a programmer back at the headquarters and be executing a reconfiguration on an entire line of automobiles. Or the user could be a mechanic trying to diagnose a problem with a car. In this way, the car becomes a programmable 'digital device' that can be re-instrumented through re-configuring a set of tag-sensor assemblies distributed through the car. Although the instrumenting of a car has been used as an example, many different applications 148 and markets 150, as described herein, may utilize the ability to reconfigure tagged assets through the information hub 5864.

Embodiments of the present disclosure may include a tag operating system 5880 that includes hybrid record and file interface features 5828, such as used in a file management system like ATA, for example. This may include allowing the user to select a preferred file format for interacting with tags, or a set of formats. The ATA standard is a file management system that is optimized for situations like asset tags that historically have small memory and require low power. Much like other standards like DOS, FAT or MTFS, there is a catalog structure and a set of records that are pointed to by a table of contents. In embodiments, the tag operating system may include features such capabilities for transferring data, reading the table of contents, parsing data in software by following pointers, retrieving directory content, pulling in records themselves, organizing records on a tag (such as to improve the efficiency), storing archival data in special locations, providing accumulators and counters (such as in multi-programmable locations) and the like. These may be accomplished by a blend of features on an asset tag and in the software library of the asset intelligence platform.

Embodiments of the present disclosure include a tag operating system 5880 that includes or supports use of one or more compression algorithms 5829 for compression of files that a user wishes to store on an asset tag 102. Historically there is an absence of standard compression algorithms for storage of data on asset tags. In embodiments, a compression algorithm may comprise a hybrid of a conventional compression algorithm such as probabilistic variable-length codes (such as a Hamming code, turbo code, or the like, or combinations of the same) a nearest neighbor algorithm, or the like, and a tag-appropriate compression algorithm that is configured to store asset data. For example, users of asset tags may wish to store spreadsheets, such as Excel™ spreadsheets and Microsoft Word™ documents, on an asset tag, such as containing various data elements, text, and formulas that are relevant to the asset that is associated with the tag. Such documents typically contain large, standardized headers that contain very large amounts of data that is common to all or most instances of the document or spreadsheet, which may, together with the data in the file, exceed data limits of conventional asset tags and which are not accounted for separately in standard compression approaches (which treat all of the data in such headers as potentially meaningful data that can only be compressed to a small extent). In embodiments, standard headers for spreadsheets, word processing documents and other common file types can be replaced by a small set of numbers to be stored on an asset tag, such as indicating a particular type of header among a set of known types. The full header information for the type of file can be stored elsewhere in the platform, such as in the hub, so that it can be re-attached to or inserted in an appropriate header element of the file (e.g., by substituting it for the numbers that were used in the compression version stored on the tag) for consumption by applications, platforms, services and the like, once data is read from an asset tag. Thus, a data file compression algorithm for storage of files on an asset tag, such as an RFID tag, is provided herein. In addition to compressing header information as noted above, the content of a file may be subject to additional compression, such as by use of hamming codes and other techniques known to those of ordinary skill in the art. Thus, a hybrid of file header compression and file content compression for an asset tag is provided.

In embodiments, version management may be used to reduce data storage requirements for a tag, such as by storing differences between a new version of a file and a prior version, rather than storing the entire new version of the file. The platform may automatically use version-based compression, without requiring user intervention.

In embodiments, various techniques can be used for compression of information, including Hamming codes and similar techniques noted in elsewhere in this disclosure. This may include variable length codes.

In embodiments, methods and systems disclosed herein may include methods and systems for storing software objects and database records on tags, including database records of the NoSQL type (where there is no requirement for heavily normalized tables as in more structured database records). In embodiments, a compression approach may be provided that allows the storing and retrieval of compressed versions of such unstructured objects by using information that can be inferred about the structure of such objects. For example, objects and records to be stored on one or more tags may exist in a common NoSQL format, such as a JSON format, about which considerable information may be understood or inferred, such as the nature of a tree or hierarchy, and the nodes of such a tree, such that a description of the tree may be stored with a given data object, rather than storing an entire tree of data. Upon retrieval of the data from a tag or device, the information about the type of tree can be accessed (such as stored in the hub or another location in or associated with the asset intelligence platform), to reconstitute the object, without storing the structure of the tree on the tag or device. Inside the structure of a typical JSON object, there is a larger amount of repetition in a hierarchical tree structure (such as with objects nested inside objects that are nested inside other objects, where the nesting structure itself is represented by many bytes of data). By inferring the structure whenever the asset intelligence platform sees an object, the repetitive structures can be replaced with much smaller amounts of data. By superimposing knowledge of the tree-type structure (e.g., JSON or other tree-based structure) where there is repetition, a much more efficient tree encoding can be used to represent the structure. For example, for a data structure that is at the bottom of a tree structure, the whole tree (apart from the data stored in it), can be quite lengthy. If the type of structure is known, it can be stated much more efficiently the node at which data resides (such as storing that it is node 2 in level 3 of tree type A).

In embodiments, further compression for storage of objects within known tree structures like JSON may be enabled by using differential coding of objects that share some structure or data. Although JSON is a relatively inefficient text-based structure as compared with more compact binary representations that are possible, it has significant advantages in being widely available, and provides a structure that is readily parsable. For example, objects in adjacent nodes of a tree that share a common parent may be stored with information indicating they are from the same parent, so that differences, rather than entire objects, may be stored for one or more of the child nodes. It may be noted that it is not conventional to store JSON, because there may be more efficient raw storage mechanisms; however, by using JSON (or a similar tree structure) as a common interchange format, along with a well-developed understanding of the structure of objects that use that format (such as identifying the types of trees used, the patterns within the trees, and the like), compression of unstructured objects can be enabled, so that tags and devices may operate to enable various database techniques described herein without exceeding the memory capabilities of the high memory tags described herein and in the disclosure incorporated herein by reference. In examples using such compression approaches, JSON format tree structures requiring 256 words of data storage have been reduced to about 70 words for the first occurrence of a JSON tree structure in a collection of records and about 40 words for repeated occurrences of the same tree structure (where the same structure is used with different data objects). For various types of objects that are not in JSON format or other well-understood tree format, the objects can be transformed into a tree format of a known structure (e.g., JSON), prior to storage, so that upon retrieval a known tree structure can be used to reconstitute the full tree with the portion of data stored on the tag or device. In embodiments, the system may attempt such conversion to JSON using various publicly available converters.

In embodiments, other techniques may be used for further compression. For example, for items like a large, structured list (such as a list of part numbers for industrial assets), such items can be stored quite efficiently, such as by storing code for generating the list from a set of rules, rather than storing the list. This may include storing a token that replaces repetition in such structures.

Compression can also be based on knowledge of classes and objects that are stored. Within a class of objects, once the asset intelligence platform has encountered a type of object, its properties can be analyzed to predict the name the order in which the various properties of the object appear, so that the system can infer the name and type of the next property. As a result, the system can store the name and type of the object, but it does not need to store the name and type of each property; instead, just the substantive data for the various properties can be stored (in the correct order), without storing the names and types of the property fields. The asset intelligence platform may maintain a map of the properties or fields and their types. Once an object class is encountered a second time, the property and field types of that object can be inferred. Instead of a tokenization of the class and properties, the asset intelligence platform can just have the bits that reflect the data for each of the properties. Such compression can be done on JSON data, mark-up language data, or other object-oriented data, where classes of objects of known type structures are used.

In embodiments, differences may be stored where the differences can be used to reconstitute data in the asset intelligence platform. For example, where a tree structure, such as a JSON structure, is understood, a template can be stored that allows use of differences, such as based on pre-defined tables or templates. In embodiments, the tag operating system described herein may automatically employ techniques that use stored information about the structure of JSON and similarly formatted objects.

In embodiments, the tag operating system may be configured to use different data storage formats based on characteristics of the data to be stored, and different storage formats may be swapped in and out to enable efficient compression. For example, some industries, such as the aerospace industry, use a common format (such as the ATA format in aerospace) to enable various parties to write and read data to asset tags. Such formats may provide encoding rules for data elements that are stored for the purposes of users in that industry. However, in some cases other data storage elements on the same tag might be configured to store data in a different format, such as one of the faster or more efficient formats described herein. Thus, the asset intelligence platform may enable nesting of data storage formats, such as using a proprietary format (referred to in some cases herein as DPFS+), such as one that uses the various techniques described herein, within a standard compression arrangement, such as the GS1 standard (under ISO 15962) or the ATA Spec 2000 format used in the aerospace industry. Such standards typically contain format elements that enable containers, and a proprietary format may be nested within a layer of the container, so that it can be used as needed. By integrating a proprietary format within a standard, the asset intelligence platform may enable use of the standard (such as for storage of data that is intended to be passed from party-to-party in an industry), while also enabling value-added features, such as compression, database-type queries, encryption, and other features noted herein, on the same set of tags. Thus, in embodiments a proprietary data storage format (e.g., DPFS+) may co-exist in a standards-compliant manner on a tag or device that is formatted for other standards. For ATA, a set of memory spaces for the ATA can be defined and constrained to leave available areas that remain available for other storage formats. For the GS1 standard, a proprietary storage format (e.g., DPFS+) can be configured so that proprietary format data exists within a GS1 container. This allows use of proprietary or unique capabilities, like storage of signatures, without violating the requirements of such standards. In embodiments, the asset intelligence platform, or an application using it, may collect objects in a generic way (e.g., collecting a list of name-value pairs, or the like). For objects that consist of conventional asset data, such as name-value pairs, or lists of name-value pairs, the asset intelligence platform (such as the tag operating system) may plug those name-value pairs into any data format that can take name-value pairs (such as a standard format like GS1, ATA, or a proprietary format like the ones described herein, such as DPFS+). The OS can handle committing data to the appropriate storage area of the tag. Where data is more complex (e.g., containing JSON structures, trees, files, images, or the like), the tag operating system can store the data in a format and on a memory location of a tag or device that can handle such objects.

Industry use cases for asset tags include closed loop and open loop workflows. Closed loop workflows may occur within one enterprise and may define both encoding and decoding, so any format can be used to store, compress and retrieve data. Open loop workflows typically a tag traveling among businesses, so there may need to be a standardized tag formatting coding to be used (like ATA or GS1). Each party can read the standard format, add data, and pass the tag on to another entity. By enabling hybrid storage of objects in different storage formats, the methods and systems disclosed herein can enable mixed workflows, such as having a tag enable a closed loop workflow (using elements of memory that are in a proprietary format) and an open loop workflow (using elements of memory that are in a standard format).

In embodiments, the tag operating system can compress objects that are not logically converted to name-value pairs or JSON formats. For example, images may already be compressed, or may be compressed using standard formats (like JPEG). The asset intelligence platform (including within the tag operating system) may be configured to recognize the object type and apply the appropriate compression type. In embodiments, the platform may automatically attempt to compress an object using one or more forms of compression (such as trying conversion to a JSON tree structure, using JPEG compression, and the like) and may automatically store a preferred or best form, such as the original object (if compression was not effective), a domain-specific tree structure form, or some other effectively compressed form. In embodiments, the platform may store a link, URL, or the like, along with access credentials. For example, an image or maintenance manual (such as in .PDF) may be stored in the platform, such as at the hub, so that it is retrieved by retrieving a pointer to the location of the object along with an access credential from the tag.

In embodiments, for an object like a .PDF, the platform may use compression based on recurring patterns, such as LZMA encoding. Thus, the platform may have built-in compression using various commercially available compression algorithms. The platform can take and automatically try to compress it, such as using LZMA compression and other compression types, and whichever one produces the smallest file size, it will use to store the information on the tag. Selection of the compression may be done on the fly. In embodiments, compression may require sub-second times to compress. Thus, the platform can dynamically select a storage format (including using different memory elements on the same tag), without being constrained to doing one scheme for all the data; that is, the platform can automatically change schemes depending on the data. For example, the platform can store numbers differently from letters, storing images differently than tree-based objects, and the like.

As an example, the asset intelligence platform may be used in connection with a form or template, where image of the form may be stored in the platform (not on the tag), such that the data used to fill in the form is stored on the tag in a known order. Then upon retrieval the data is automatically filled in after retrieving the form from the library. The platform can store and reference the form. Where form is associated with a workflow, things like approvals and signatures can be stored on a tag for an asset, without storing the form itself.

It may be noted that getting data in and out of tags can be slow. With knowledge in the platform (e.g., the hub) of the data formats and memory layouts (and with cached data from previous uses of a set of tags), the platform may maintain knowledge of which data stored in the platform is safe to re-use without re-reading a tag. For example, if data is known to be written to one-time programmable memory elements of a tag (i.e., it can't be re-written), then the platform may know that once that data is read from a tag, it can be used without re-reading the tag. This is also true for items like certificates that typically do no change. Data that does not change can be pulled from the hub, rather than re-reading a tag. Once a tag has been seen, data can be passed to the hub and then passed to other devices or applications that haven't seen the tag, so that those don't need to read the tag. Thus, the hub may act as a content delivery network to move data to where it is needed far faster than doing it in a brute force way.

In embodiments, the hub may include local caching of data with knowledge of the format used for storage on a tag. If reading the data from the tag potentially provides updated information (such as reading tags from memory locations that might have been written), knowledge in the platform (e.g., the hub) of whether a tag has been re-written can be used know whether it is safe to use the cached data, or whether the data has to be read from the tag itself. Thus, the asset intelligence platform (including the OS and hub) to identify where is the best place to get the information. For example, where a tag is an ATA tag that contains certificates within custom fields, the certificates can be pulled and compared to past certificates for a tag. If the certificates have not been changed, then the prior data in the hub can be used without pulling more data from the tag. If the certificates have been changed, then data can be pulled from the tags.

In embodiments, a public key approach may be used, such as to make data available on tags that travel in open loop workflows where tags may contain data that should be accessed only with a user that has the appropriate key. Data may be encrypted with a public key such that the original "plain text" data can be accessed only with the correct private key.

In embodiments, a distributed key approach may be used, such as a block chain, where there are distributed private and public keys. This may include building and storing deltas on the data stored across various devices. This may include using timestamps and a distributed ledger, such as to build a block chain for a given asset, which may be stored on a tag or in the hub.

Many aspects of the asset intelligence platform make it ideal for use with blockchain technology. For example, the tag travels with a tagged asset and is such an ideal platform for maintaining the archive of records that form blocks within a growing blockchain, with each block being verifiable and secure via cryptographic authentication and time stamping.

Embodiments of the present disclosure may include a high-speed search. Where data is stored using a template structure, the knowledge of the template structure may enable rapid searching of a tag 102, such as based on knowledge of where the data is stored on the tag.

In embodiments, data for multiple tags 102 may be pulled in a background task, such as pulling data form tags 102 that is predicted to be most likely to be pulled next, such as based on patterns of retrieval. For example, if data about a part is retrieved, additional data about that part may be pre-retrieved and stored in the hub 5864, enabling it to be accessed more rapidly than waiting for further reading of a tag 102. Additionally, data may be available at a reader from previous sightings whether or not the data is available from the hub. Thus, when a user needs more data, that data is already fetched and loaded into the asset intelligence platform 5802. This may include pre-fetching data across multiple tags 102 where it is known that the tags 102 potentially have relevant data to a given initial action by a user, an application, or the like. This may include using application programming interfaces or the like that allow collection, and it may include using a daemon or the like to collect and pre-cache data from multiple tags 102.

Pre-fetching may be based on encoding type, such as using prior knowledge about the structure of information stored on the tag 102 where available.

In embodiments, the asset intelligence platform 5802 includes remote and/or back-up provisioning of assets, such as creating necessary licenses, allocating them to devices on which a narrator can be installed, and the like, each of which may be accomplished in the hub 5864 described herein. Provisioning may include providing settings (such as for various applications that may consume information stored on tags and for readers, gateways, or the like), define assets (such as defining asset types that are tagged), and the like.

In embodiments, the tag operating system 5880 of the asset intelligence platform 5802 may include anti-cloning and counterfeit detection features. For example, the platform may use a Public Key Encryption method, where data is encoded with the private key, and anyone with the public key can verify that the tag is authentic and that the data has not been tampered with. In embodiments, such as for particularly sensitive deployments, chips or tags may be provided with specific, proprietary memory organization, such that the chips or tags only work with private, proprietary control commands. By exercising such a structure, a platform can have a very reliable way to make sure it is dealing with an authentic tag or chip. That is, the signature of the processing capabilities of a chip or tag may be used as clone-detection feature. This provides additional security relative to conventional anti-counterfeiting features of RFID tags, which may be relatively easy to defeat.

In embodiments, mitigation against cloning and counterfeiting takes advantage of a second number (in addition to a number like an EPC number) that can be stored in a tag, referred to herein as the TID (tag identifier) number. The TID number may be used to identify the tag itself, as opposed to the EPC number, which identifies the tagged item. In embodiments, the TID number may be programmed by the chip manufacturer as part of the wafer fabrication process, and may be programmed in a permanent fashion. It may also include a serial number and may be managed to ensure global uniqueness.

Because the TID number is expected to permanent and globally unique, it can be combined with the EPC number and other data to make creating a forged tag much more difficult. When new tags are obtained and legitimate EPC numbers are copied into them from existing tags, the corresponding TID of the new tag will be incorrect. However, even though the TID number is expected be permanently programmed by the chip manufacturer, chips with open TID banks are in some cases available in the marketplace. This makes it possible for a complete tag clone to be created by copying both the EPC and TID numbers into a new tag. Even without obtaining tags with open TID banks, in some circumstances it may be possible to use a tag emulation device to transmit a desired TID+EPC combination.

In embodiments, an asset tag may have a TID bank that is permanently programmed with a globally unique serial number during chip manufacturing. It is not possible to change this number, and a manufacturer of tags or chips may decline to provide chips with yet-to-be-programmed TID numbers, so that the chips from that manufacturer are verified to have globally unique serial numbers in the TID bank. An asset intelligence platform may mandate use (optionally with respect to critical processes that involve the need for authentication, anti-cloning, anti-counterfeiting, or the like) only of chips or tags that have verifiable global identifiers (and that come from manufacturers that do not provide chips of that type that can be later programmed with new TIDs). In embodiments, the asset intelligence platform may verify that a chip comes from a permitted manufacturer by using a combination of features contained in the hardware of such chips, optionally along with algorithms implemented in software for the chip. Several techniques may be used for verification. First, the asset intelligence platform may check that the TID bank of a chip that is being read includes an approved manufacturer's ID. Because TID banks from other manufacturers can be modified to include that same TID, this is a simple first check and may not be sufficient for a strong level of security. The remaining checks may use two principles. First, chips may be provided that use a proprietary memory organization and second, chips may be provided that use hidden commands and hidden memory locations. For example, a set of authorized chips may be provided that have memory that is organized into memory banks (e.g., four memory banks for EPC, TID, User, and Reserved memory areas), each with a flat address space. The authorized chip may present this same organization to the user, but behind the scenes (invisible to the customer or end user) the memory may be made of up many more structures. For example, memory can conceptually be divided into storage and control. The storage sections may be there for the user to store data, as with other chips. The control memory may include structures that configure the chip memory and functionality. If data is directly written to control structures, it will cause the chip to behave in unexpected way unless the overall chip and memory organization is well understood. The design and memory organization may be kept confidential to the manufacturer, such that each manufacturer's memory organization is different from that of other chips on the market. If someone sought to copy the chip design, the internal organization may be so complex that it would be extremely difficult to understand and duplicate.

In addition to the unique memory organization, the authorized manufacturer's chips may include non-standard commands that are invoked using non-standard methods. For example, a chip protocol may dictate that commands be sent by the reader in a group of words that include command, address and data fields. The latest standard for RFID commands defines 27 commands. In embodiments, a manufacturer may use the standard commands along with an indirect addressing scheme to implement an additional set of hidden commands that may be kept confidential. The hidden commands may provide access to internal structures on the chip as well as direct access to control memory.

Taking into account all of this knowledge of the chip design, it becomes possible to design algorithms into software running on a reader that can test for the authenticity of the authorized manufacturer's chip. One method to address this may use the inclusion of a physically unclonable function (PUF), but other techniques are also possible. For example, if certain hidden commands are performed, the chip will behave in specific ways, and particular data values will end up in specific locations in memory. Without knowing the underlying design, predicting the outcome of these commands is nearly impossible. Even knowing what commands exist and how to invoke them is extremely difficult.

The software tests for authenticity may be organized in a layered fashion, providing together a high likelihood that a chip is in fact from the authorized manufacturer. Once enough time goes by, or if there is evidence that a set of tests has been compromised, a different set of tests can be deployed. In this fashion, the integrity tests can be kept quite secure beyond the likely usable lifetime of any product.

Once it is known with a high confidence that an authorized manufacturer's chip is in use, which includes an unimpeachable TID number, in embodiments a next step is to use software to create a signature that is stored in the chip that can detect any tampering with stored data. This provides an additional layer of confidence that the EPC and TID numbers have not been modified, and also eliminates the need to distribute a database of (TID, EPC) pairs. In embodiments, a signature scheme may use public-key cryptography. In this technology, a pair of keys are mathematically generated such that data encrypted with one key can only be decrypted using the other key. Additionally, if the value of one key is known, it is computationally prohibitive to generate the second key. One of these keys is typically known as the private key and is kept secret. The other key is known as the public key and can be widely distributed. One use of the key pairs would be to verify the origin of a document. If the originator encrypts the document using the private key, it can only be decrypted using the public key. Even though anyone can get access to the public key, only the originator has the corresponding private key, so the source has been confirmed.

Use of this scheme takes advantage of additional storage space in a high memory chip or tag as disclosed herein and in documents incorporated herein by reference. The asset intelligence platform may run software that first undertakes the steps described above to verify it is an authorized manufacturer's chip that it is talking to. Once that is confirmed, the TID and EPC numbers are read from the chip. Software then combines the numbers and encrypts them using a private key, which is always kept secret. The resulting signature is written back to the chip.

To verify that the chip and stored data are authentic and unchanged, software is used to read the signature and decrypt it using the public key. The results of the decryption step are the original TID and EPC numbers, which are now compared to the numbers stored on the chip.

Notice that in this solution, the cumbersome distribution and update of TID+EPC pairs is not required. Only the single public key needs to be distributed, and it can be distributed in a non-confidential manner. For increased levels of protection, it may be desirable to update the private key periodically. In this case, public keys may be published and associated with EPC data ranges, again in a non-confidential fashion. It is even possible to use a new private key for every EPC number, if the proper publishing mechanism is in place. In other cases, keys may be logically assigned to organizations in ranges, as in many cases an EPC number contains elements identifying a particular manufacturer.

Figure 5:
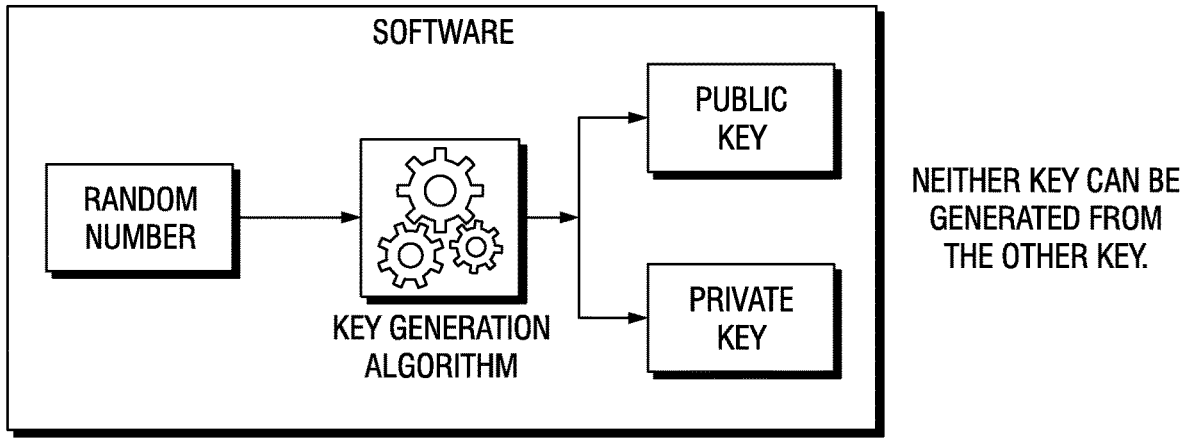
FIG. 5 illustrates an embodiment key pair generation using standard cryptographic algorithms.
Figure 6:
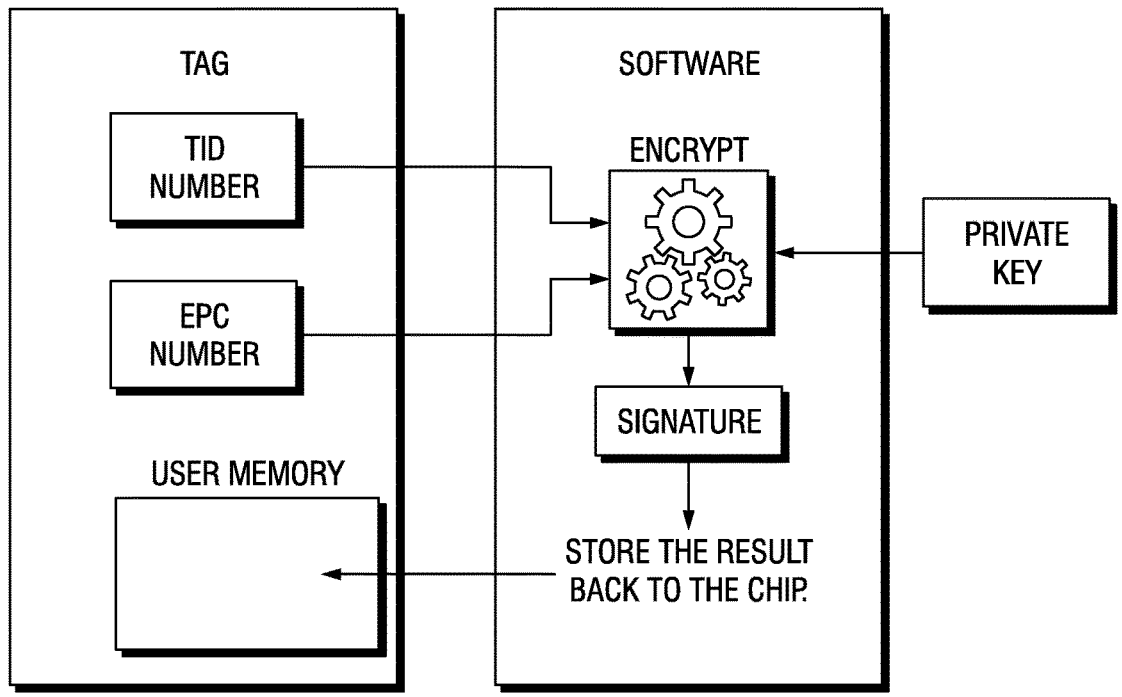
FIG. 6 illustrates an embodiment digital signature calculation.
Figure 7:
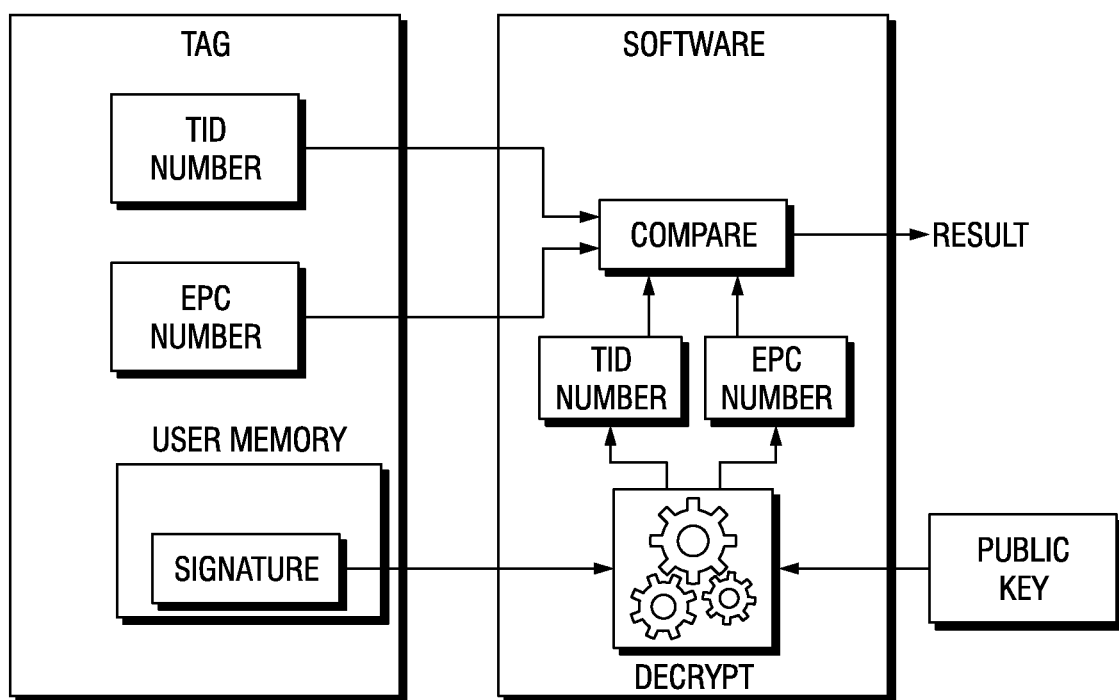
FIG. 7 illustrates an embodiment verification process.

The overall solution is shown in FIGS. 5, 6 and 7. Referring to FIG. 5, the key pair is generated using standard cryptographic algorithms. Referring to FIG. 6, a digital signature is calculated and stored in the chip. Referring to FIG. 7, in the verification step, the signature is read from the chip and verified.

In embodiments, the asset intelligence platform 5802 may be deployed to multiple, heterogeneous clouds, such as an Azure™ cloud, an Amazon™ cloud and a Google™ cloud, with appropriate data integration capabilities, business logic and user interface elements to allow users of each cloud to work in their preferred native environments while seeing assets and the information stored on them as conventional storage elements, such as viewing the assets as a database, a set of files, or a set of objects (e.g., images, documents, .pdfs or the like).

In embodiments, a wide range of beneficial activities may be enabled or undertaken using the asset intelligence platform disclosed herein, including ones enabled by distributed memory capabilities described throughout this disclosure. These activities may use one or more of the capabilities noted above, as well as combinations of those capabilities, such as for preserving confidentiality, reducing network reliance, providing authentication, enabling rapid operations at the point of work, and others. These may include activities involved in a workflow (such as using knowledge about an item to make decisions about the next steps in the workflow), activities involved in inspection (such as where a workflow is governed mainly by a process of checking or inspecting, followed by moving on to another step or workflow), activities involved in process verification (such as confirming that an operational step has been performed), activities involved in authentication (such as confirming the truth or accuracy of an attribute), activities involved in providing a pedigree (such as verifying a process with a certificate or the like), and many others.

In embodiments, a workflow is enabled by using knowledge about an item to make decisions about next steps in the workflow. In workflow activities, asset data may be used to make decisions about what downstream steps are to be taken with a tagged asset. Data may be read from the asset to provides information on what to do next, such as in a workflow defined by one or more business rules, including as enabled by the business rules engine described elsewhere herein. For example, a traditional aerospace MRO application is an example of a workflow activity. Birth records and part-history records may be added to assets during various events, such as to facilitate a workflow for the maintenance of the asset. Data is read from the asset so that the part can be reliably identified and certain historical information known, so that decisions about repair, service and overhaul steps can be made. Workflows may include maintenance and repair operation workflows, such as for large-scale industrial environments, such as aerospace and other large-scale transportation environments, heavy manufacturing environments (such as automotive and heavy equipment manufacturing), energy production, drilling, mining, and others. Workflows may include medical and healthcare workflows, such as involving manufacturing, sterilization, assembly, inventory tracking, and others. Workflows in health care environments like hospitals may involve tagging items at the time of creation with information about identity, storage instructions, handling instructions, use instructions, and the like. Upon delivery to the hospital and at various other steps, hospitals can use the data stored on an asset to make decisions about routing, handling, checking for expiration, etc. and can store additional data, such as to enable later steps based on the data. Workflows can include working involving handling of items, such as manufacturing line workflows, research and development workflows, and many others.

Embodiments may include inspection. Inspection activities are a form of workflow activity. For an inspection activity, tag data may be read and checked for some attribute, such as an expiration date. Often, the next step in a workflow is to do nothing, because inspection criteria are satisfied. In other cases, a failed inspection may kick off different steps, such as to pull an item out of a workflow, to send an item to further inspection, to send an item to be refurbished, or the like. An example of an inspection activity is an airline inspecting the life vests in a cabin before a flight. The life vests must be verified to be present and not expired. Most of the time the vest is present and has not yet expired, so the inspector simply moves on to the next one. If a vest is expired, it is removed and replaced and the inspection continues. Other airline workflows include checking other items in the cabin (such as oxygen canisters), as well as items on the flight deck, checking parts, checking systems, and the like. Storing information on the assets that are inspected allows for rapid decision making at the point of read, as well as data sharing among different enterprises without requiring a centralized database. Another example involves inspection of operational machinery, such as valves in an industrial process. Tags can be used to facilitate inspection of valves to see if there are due for service, such as based on recommended duration of use and based on records from past inspections. This workflow component facilitates maintenance activities.

Embodiments of use of an asset intelligence platform may include process verification, such as confirming that an operational step has been performed. Many situations require that assets can be checked to confirm that they have gone through particular process steps. In a process verification activity, tag data may be read to verify that previous steps in an operational process have taken place. Business rules may be defined to determine what fields should be read, and what values or ranges of values should be found, what operations should be performed, and what data should be written in connection with verifying a process stop. For example, tags may be used to keep track of which items have been gamma sterilized. A reliable method of writing to the tags immediately prior to or after sterilization can be used to create a "sterilized" flag to be set in tag memory, so that subsequent operations can verify that the sterilization process took place. Improved quality processes are enabled, because items can be double-checked for sterilization or other process steps before they move on to another process or environment. Other examples of process verification include using tag data to keep track of the number of times a lead vest has been exposed to x-rays (in order to pull the vest out of use when a limit is approached), verification that fire safety equipment, alarms, or the like have been inspected, verification that batteries have been changed, verification that refillable elements (such as lubricating fluids) have been changed, verification that software updates have been installed, verification that security procedures have been completed, and many others.

Embodiments of use of an asset intelligence platform may include authentication, such as confirming the truth or accuracy of an attribute. Most commonly, the attribute may be identity, i.e., that someone or something is who or what it is supposed to be. A good example of authentication activity is the detection of counterfeit goods. During manufacturing, or at any point before an asset is released, an impossible-to-replicate tag may be added to a part or other item, with a cryptographic signature included. In the field, any user (e.g., a retailer, distributor, purchaser or end user) can read and decrypt the tag data to determine whether the item is authentic. Examples of authentication may include detecting counterfeit parts on heavy equipment, validation of authentic parts or items for refills (e.g., for inks and 3D printing materials for printers), detecting counterfeit consumables (e.g., counterfeit drugs), authenticating records (e.g., records created in a supply chain for heavy equipment as various parties interact with the records related to a part, such as by storing a security certificate for each new record to authenticate the identity and signing authority of the record creator) and authenticating pairs of parts (such as having a parent machine authenticate that a correct child part is being attached (such as a pump verifying a correct tube is being attached, a tool verifying that a correct attachment is being attached, or a stylus verifying that a correct cutter is being attached).

Embodiments of use of an asset intelligence platform may include establishing a pedigree, referred to in some cases herein as an ePedigree, that provides process verification with certificates. An ePedigree solution may comprise a combination of activities described in this disclosure. It may comprise a process verification activity, an inspection activity, or the like, with the addition of security certificates, such that in addition to verifying that a step was completed, the identity of the entity performing the step can be confirmed, optionally along with whether or not the entity was authorized to complete the step. An example of an ePedigree is a solution for tracking pharmaceuticals throughout a supply chain. At every step in the chain, enterprises have the responsibility to create records about their involvement with the asset. In embodiments of an asset intelligence platform, those records may be stored on the tag, including relevant operational data, information about what entity interacted, and a certificate authenticating the tag and the entity interacting with the tag. At any point, someone using the asset intelligence platform may verify that the asset was where it was supposed to be and that an appropriate entity interacted with it. Adding security certificates along with the records ensures that information was not falsified or handled by an unauthorized person.

In embodiments the asset intelligence platform may provide for photographs of the asset. These photographs help share information, have an expert examine them, act as proof of repairs or inspections, be an image of the environment local to the asset, and the like. These photographs may be saved and loaded onto a tag and/or stored on the hub and/or shared with other systems.

In embodiments, the asset intelligence platform may provide for saving configurations and settings, such as communication settings between readers 140 and tags 102 (e.g. power, sensitivity, Q-value, communication speed), between tags and other tags (e.g., amongst a group of tags associated with a tag database structure), between readers 140 and deployment computing system interconnections and infrastructure, and the like. These settings may be stored and modified by the user as part of the deployment management through the asset intelligence platform 5802, such as for re-use and sharing of objects across applications, providing framework for validating business objects, providing clean separation of business logic and user interface and other external connections, and the like.

In embodiments, the asset intelligence platform 5802 may be used for lifecycle management and service and may include the features related to manufacturing, such as load machine configuration (or check) product configuration; digitization of manufacturing information, location, date, lot, materials, company cage code, SW Version, configuration data; digital image upload; digital product labeling (e.g., UDI+EPC or GS1+EPC, etc); digital box tag w/list of entire contents inside; digital pallet tag w/list of all boxes and/or individual contents inside; write digital ASN, and the like.

In embodiments, the asset intelligence platform 5802 may be used for distributor-related and life cycle management-related features, such as read digital ASN/Write another ASN; digital inventory check in (e.g., down to individual asset/product list); digital inventory reconcile (e.g., down to individual asset/product list); e-mail notification of receipt of shipment from asset itself; Alert notification (e.g., notify of recalls/expiration/shelf life, storage details, handling precautions, ongoing care); document that special processes were adhered to, and the like.

In embodiments, the asset intelligence platform 5802 may be used for use-maintainer related features, including for life cycle management, such as for read birth record; add part history record; run archival analytics; add a certificate of formula compliance (CofC) document; replacement part re-order email to manufacturer; time and date stamp of 'reads' for malicious non-reporters, and the like.

In embodiments, the asset intelligence platform 5802 may be used for regulatory and process compliance and may include the following relevant features related to manufacturing: manufacturing and assembly process compliance; gather sequence information/time and date stamp each; quality check that processes were completed in correct order; compliance inspection (time/date and/or initials); sterilization (time and date stamp); calibration or configuration data set/data check; input alert notification data; death or end-date tracking; and audit and reconcile.

In embodiments, asset intelligence platform 5802 may be used for regulatory and process compliance and may include the following distributor-related features: alert notification; notify of recalls/expiration/shelf life; storage details related to compliance; handling precautions for compliance; ongoing care related to compliance; write that special processes were adhered; send email about compliance (time/date stamp), and the like.

In embodiments, asset intelligence platform 5802 may be used for regulatory and process compliance and may include use/maintainer related features: chip ID validation for compliance; alert chip present=non-compliance; email notification to appropriate party; time and date stamp each use or activity; and add a CoC documentation, and the like.

In embodiments, the asset intelligence platform 5802 may be used for integrity management and may include the following features related to manufacturing: chip ID; digital signature application/verification for anti-counterfeit protection; certificate application/verification for e-pedigree; and the like.

In embodiments, the asset intelligence platform 5802 may be used for integrity management and may include the following distributor-related features: chip ID verified; read certificate/verify/sign another certificate; read digital signature/verify/sign another digital signature; chain of custody audit; ASN to next vendor, and the like.

In embodiments, the asset intelligence platform 5802 may be used for integrity management and may include the following use/maintainer related features: chain of custody audit; alert notification via email of break in chain and A.OK if no break; chip ID validate; time and date stamp; alert if no chip present; email to appropriate party; digital signature validate/write new signature/email notification "service contract maintained" or "problem alert"; digital certificate validate/write new certificate/email notification "service contract maintained" or "problem alert"; time and date stamp of reads for malicious non-reporters, and the like.

In embodiments, license creation, optionally in the cloud, may include: Login to a cloud as an administrator; add information about customer; add information about number of devices, which customer is allowed to connect to cloud; add expiry date of license; save information; unique number will be generated by module (a. code will be used to link all users from same organization; b. customer needs to use this code to login to web and device first item to identify themselves; c. other users from the same organization also need to use this code to register themselves with cloud console).

In embodiments, customer registration (optionally in the cloud) may include: users register themselves to the hub with given code (a. cloud validates the code and allow user to login, b. if code is valid and not used before, user will be considered as "admin", c. if code is valid and used before, user will be assigned role of "user", i. there may also be a role of "manager", ii. admin can change role of any users, d. a user may need to give user name and password at the time of registration, which he can use to login next time, in embodiments, the user does not need to provide the code for subsequent logins).

In embodiments, asset type creation (optionally in the cloud) may include: admin logins with his user name/password; admin can at any time, upload enterprise level documents, which will be available to all asset types; click on create asset type (a. user will be shown following fields: i. name, ii. image, iii. encoding scheme for EPC (SGTIN, SSCC or ATA), iv. ability to upload asset type specific documents, v. ability to save asset type by at least providing name and image); admin can anytime, edit any of the asset type information; admin can also add/delete both asset specific document and enterprise level documents.

In embodiments, asset definition (optionally in the cloud) may include: admin logins with his user name/password; for already defined asset type, admin can either (a. define asset information record, b. define action, c. define associated asset types i. where admin can link already associated asset type to current asset type); to define asset information record (a. configurable list creator will be shown to admin, so admin can define name of fields, type of fields and validation for each of these fields); to define action (a. configurable list creator will be shown to admin, so admin can define name of fields, type of fields and validation for each of these fields, b. by default action name field will be there for admin to specify).

In embodiments, specification of application settings (optionally in the cloud) may include: admin logins with his user name/password; for already defined asset type, admin can either (a. define asset information record, b. define action, c. define associated asset types, i. where admin can link already associated asset type to current asset type); to define asset information record (a. configurable list creator will be shown to admin, so admin can define name of fields, type of fields and validation for each of these fields); to define action (a. configurable list creator will be shown to admin, so admin can define name of fields, type of fields and validation for each of these fields, b. by default action name field will be there for admin to specify).

In embodiments, login to a device for the first time may include an application asking for code; application may send the code along with the device serial number for validation (a. it checks whether license is valid or not, b. it checks whether limit to allowed number of devices is reached or not, c. it checks whether user should login to use application or not, d. at least one asset type and its definition may be defined, e. if all above is valid, the cloud registers the device and sends a license file for offline usage); if device registration is successful and if user has to login then login screen will be shown; once login is successful (if any), device syncs asset types, images, definitions, documentation (if allowed by settings) and stores for offline usage; for next time onwards, whenever user logins (a. application checks for validation of offline license, b. if valid, application checks for updates in device registration, application version and asset type/definitions and documentations, if any update, sync the application).

In embodiments, asset commissioning, optionally on a device, may include: user scans for assets in the range of the reader (application will try to parse EPC); User clicks on EPC code; application asks user to specify asset type (a. user can cancel operation at this time and scan for assets again); based on selection of asset types, asset information record and required field for encoding scheme of EPC is shown to user; user has to provide information for at least all mandatory fields (a. application will validate the values based on validation rules defined for each field); user clicks on commissioning (a. application writes both EPC and asset information record (by default with compression), b. image of the asset will not be stored in user memory); if digital certificate is provided, certificate will be written to user memory too; if encryption is enabled, data will be encrypted.

In embodiments, asset updates, optionally on a device, may include: user scans for assets in the range of the reader (application will try to parse EPC); user clicks on tag URI (already commissioned tag); application reads complete user memory for all records (a. if not successful, user will ask to commission tag (see use case 7), b. if digital certificate (if any) of tag is not same as asset's digital certificate (if any), error will be shown, c. if decryption of data is not possible using key of asset type, error will be shown); if successful, application also downloads alerts information related to asset and its associated tags (if any); user is shown with asset information, image, all asset action records (if any), all documents/links (if any), alerts (if any) and validation errors (if any); at this time, user can either (a. take action or add document or associate other assets of allowed asset type (enabled only if defined in asset definition)); on take action (a. user will be asked to choose action type, b. based on action type, configurable list will be shown, c. in addition, user can also set up alert, which will be shown when we read asset next time); on documents (a. if offline documents available, user is shown all offline documents from local storage; otherwise document list will be fetched from cloud, b. user clicks on document to view (download if not cached), c. user clicks on write to document (based on settings link or complete document will be stored); on asset association (a. application will ask user to scan for nearby tags, b. only allowed asset type's tag will be shown, c. user can click on one or many discovered tags to build association, d. it will be checked that there is no cross association between assets); general (a. before adding any record, it will checked whether there is enough storage in tag available to store information, in case of not enough storage, error message will be shown; b. all records will be written sequentially from beginning of the record, c. DPFS+ or another file system could be used to store record information, d. validation of each field, digital certification, encryption and compression will be applied as per settings, e. after each write, data will be sync to server (if network is available, otherwise it will be cached to be sync later), f on main page of the application, indication will be shown if there are data to sync, data will be sync as soon as device is in network, g. if application is allowed to work offline, all this information will be stored in local storage too.).

In embodiments, an asset finder application or component of the platform may, provide a user the ability to find/locate a particular asset or group of assets that match a common set of criteria. examples include finding one asset that is in any of several boxes inside a warehouse, the ability to locate a set of items that were part of a manufacturing batch that needs to be recalled, etc. the asset finder may locate an item, for example, as a user moves a reader, such as an RF reader, nearer to the item being located, at which point an indication of its proximity to the reader may be provided visually and/or with sound, such as using Gieger and other search algorithms. a user may also have the ability to pause and continue the asset finder, so that there is time to take action on the located asset before moving on to locate more assets. the search criteria to locate assets can be created either on the edge device and/or the hub.

In embodiments, part audits, optionally on a device, may include the ability to find if all parts of a certain asset are present and are not counterfeit. alerts associated with assets will be downloaded from cloud or local storage; asset definition of associated tags should have been downloaded at the time of parent tag information sync; all update to associated tags will be sync with cloud and local storage (if local storage is enabled).

In embodiments, reports, optionally on a cloud, may include a set of reports that are standard to the system and the ability for users to define and create their own set of reports. standard reports may include: activity report (a. show number of active device per week (default last one year), b. shows number of tags access per week across device (default last one year); user audit report (a. shows which user has used, which device to perform which operation on which tag in specified time (by default last month)); asset type report (a. shows assets by number of written records by given asset type); alert reports (a. shows all assets with alerts by given asset type (if specified; otherwise all asset types); asset by criteria report (a. shows all assets with giving field of given record with specified value); asset timeline report (a. shows assets by last updated by (shown by default by quarter) by given asset type). Custom reports may provide users the ability to create their own report based on a defined static or dynamic search criteria, ability to define how the report needs to be sorted etc. and the ability to save and run the report either on the hub or on narrator.

In embodiments, on device reports may include: audit report (a. shows whose login to device, each read and write operation performed, on which tag); user can also fetch all reports available on console. In embodiments, asset intelligence platform 5802 may be used to provide a performance optimized, easy to use common platform for building apps quickly and reducing their maintenance footprint.

In embodiments, from the app developer perspective, asset intelligence platform 5802 may allow a developer to consolidate frequently needed/rewritten/pasted functionality into a common configuration item that can facilitate reuse without changing existing code; architect and plan such that functionality is exposed in chunks that have a logical level of abstraction for their purpose and suitable interfaces; requirements of design are as important as requirements of function, as ability to, and the like.

In embodiments, code re-use may be an objective, such as to maximize the ability to use a single code base across ancient and modern platforms; expand and optimize the functionality and performance in the reader-to-tag space, so as to: address more applications; and improve performance; and provide a quick start platform for new apps, with a high level of performance, a much higher level of abstraction than low level RFID, and the like.

In embodiments, architecture and design of interfaces for the asset intelligence platform 5802 may be designed to facilitate simple development of applications, maximize reuse and allow expansibility without having to change the code. In embodiments, asset intelligence platform 5802 features may include: use of standard Windows and Xamarin interfaces for library use within same platform (e.g., business logic and GUI are totally separated so that business logic is more easily reused; GUI will automatically be updated to reflect changes within the business logic; GUI events are automatically sent as business events to the business logic). In embodiments, the asset intelligence platform 5802 features may include: acting as a service when interfacing to dissimilar or external systems (communicates over web-services using JSON encoding; selectable 'drive' functionality to interface to existing applications (including drag and drop via desktop)). In embodiments, the asset intelligence platform 5802 plug-in interfaces may allow functionality to be added without changing code (reader functionality; application specific EPC codes; different user memory formats (e.g. ATA Spec 2000, ISO 15962)).

In embodiments, the asset intelligence platform 5802 may optimize reader-to-tag interaction and enables seamless integration with the IoT in a manner that allows solution providers to focus on core business issues rather than RF and data issues.

In embodiments, the asset intelligence platform 5802 features may include optimization read, write and search of individual tags and also large tag populations; allows new readers to be added via a plug-ins architecture; web services capabilities for language independent interface to external systems; includes business level abstractions versus banks, addresses and words; handles EPC's including encoding, decoding, translation to and from human/middleware formats; provides optimized DPFS+ format and allows other user memory formats to be inserted; provides ISO/UDI format and GS1 bar code decoding; supports proprietary commands such as I2C sensor interface, write depth, etc.; platform for defining, implementing and validating business objects and binding them to GUI; logging through development and in field; license/functionality management, and the like.

In embodiments, the asset intelligence platform 5802 may include internal DPFS+ functionality, a highly optimized data-independent format that is used to convert between customer business information and the words stored in tag memory.

In embodiments, the asset intelligence platform 5802 features may include: facilitates management of both file and object data (ultimately database records too); very low overhead 'container' format for data; compresses data on the fly, reducing read/write times and storing more data in tags; saves entire history of changes to records so that an audit trail can be recovered; unlimited write depth; ability to recover from partially written data without tag being considered corrupted (stretch goal); implementation of data format/open interfaces for customer access to information.

In embodiments, a reader driver may offer a common interface to different readers as successfully used in viewers, such as a viewer, and may add many capabilities including selection of larger tag populations and more opportunities for optimization. In embodiments, the reader driver features may include: supporting selection, multi-tag, multi-command functions and asynchronous operation (not all readers support all functionality, e.g. ATiD can only select by EPC; Architecture splits driver into two interfaces (Implementation interface for partners/equipment vendors to add a 'generic reader implementation, optimized interface for partners to use within applications); optimization logic between the interfaces "adds value" and optimizes user experience.

In embodiments, the asset intelligence platform 5802 may include a logging framework, which may be a platform-independent interface for logging which allows various logging frameworks to be injected into the framework.

In embodiments, Windows platforms, including compact framework, may inject log4net as the default framework, providing a comprehensive capability that allows various levels of logging (debug, info, error, etc.) to be turned on and off at a class level. An embodiment allows the logging to be configured by the developer. Embodiments may allow the user to install a log configuration file that allows the system to turn additional logging on and off for customer specific problem solving. As configured, info level entries from the current run are saved, plus error level entries from all runs (subject to a maximum file size).

An example logging call is as follows: this.Log( ).WarnFormat("{0} mode tables were found.", modeTables.Count); The asset intelligence platform 5802 may include a task parallel library. Many newer platforms use the Task Parallel Library (TPL) in preference to traditional threading, which isn't even available in typical portable libraries and so cannot be used in many cases. The official TPL isn't available in the compact framework, and so for that platform DOS has implemented a library which behaves in a similar manner to TPL, allowing for a consistent multithreading framework across all target platforms. Note though because of compiler issues, it is not possible to use the async and await keywords in the compact framework, and so DOS does not use them.

An example a call to perform execution and then report completion in a different thread, such that the main thread continues immediately without waiting for completion follows:

```
Task.Factory.StartNew( ( ) =>
{
PerformExecution(selection, operations, settings, population)
OnExecutionComplete( );
} );
```

In embodiments, the asset intelligence platform 5802 may include file handling. Conventional file handling is not typically available within portable class libraries, and so the third party PCLstorage library is included in DOS to replace this. As this library is not available for .NET 3.5 and compact framework platforms, for those platforms DOS has implemented a library which behaves in a similar manner allowing for consistent file handling across all target platforms. As PCLstorage uses an asynchronous model and DOS cannot really take advantage of this because of the limitations with await and async on compact framework, the use of PCLstorage may be introducing unnecessary complexity and therefore may need review.

In embodiments, the asset intelligence platform 5802 may include data handling. This may include capabilities for diff-match-patch operations, LZMA compression and Reed-Solomon error correction (which allows N corrupted words to be corrected by the addition of 2N parity words).

In embodiments, the asset intelligence platform 5802 may include business logic for property management. This may include an early implementation of a base business object 'Model' which provides the base functionality needed to implement objects containing properties, perform validation, localization/internationalization, report changes and to bind to user interfaces. The implementation makes extensive use of reflection and so is able to accommodate unknown business objects from outside the OS as would occur when implementing an application that uses DOS. In embodiments, a compact framework targets support the BindingList for binding to Windows Forms based user interfaces. Embodiments may support the ObservableCollection for XAML based interfaces.

To implement a business object, say an SGTIN (although this object will shortly be part of DOS), the developer need simply subclass the Model, add the necessary properties, and then the code that must be written to update the user interface when the SGTIN changes (or visa-versa) is:

var propertyList=new PropertyBindingList<PropertyRow<string>>0;

propertyList.AttachTo(sgtin);

dataGridView1.DataSource=propertyList;

In embodiments, the asset intelligence platform 5802 may include a reader framework, which may be reader independent. The tag operating system 5880 may include a common interface to allow different readers to be used. An embodiment may include the basic 'ReaderImplementation' base which allows readers to be implemented.

In embodiments, Other embodiments include functionality to a 'Reader' wrapper which provides optimization and other ease of use features.

In embodiments, the asset intelligence platform 5802 may provide the following functionality that is new relative to the current common reader driver: full implementation of select, allowing ranges of memory in banks to be matched (previously select was EPC). (example uses include: select unprogrammed tags; select tags (or other proprietary format tags); select case tags); compound selects, e.g. select unprogrammed tags; timed and rounds based execution; compound commands, e.g. read TID and user data in one call; sessions (allows tags to be ignored once they have been read); More visibility of and control of Gen 2 RF modes; reporting of tag signal strength (release 1) and frequency (future); multi-antenna (allows antennas to be selected and also best antenna reported); synchronous and asynchronous execution.

Example timing data by mode is shown below (note though that some modes may be preferred over speed for reliability in some applications): The asset intelligence platform 5802 may facilitate a simulated reader that may extend reader implementation, such as with commercial readers; works with a simulated tag (save tags in a directory as files, load them in the startup, create new tag). Example code is as follows:

```
SimulatedTag tag = new SimulatedTag(tid, epc);
SimulatedTagPopulation.AddUniqueTag(tag);
Supports multiple selection criteria and Read / write commands
IReaderImplementation_reader = null;
if(connectSettings.Equals("Simulator") ) {
reader = new SimulatedReader( );
} else {
// As of now X
reader = new XReader( );
}
_reader.Connect(connectSettings);
_reader.Initialize( );
_reader.ExecutionComplete += new
Action(m_ReaderInterface_ExecutionComplete);
_reader.TagResponse += new
Action<TagResponse>(m_ReaderInterface_TagResponse);
```

TABLE 1

The following table describes use cases for a narrator

| # | Name | On Device | On Web (Cloud) | Description |
|---|---|---|---|---|
| UC1 | License Creation | | X | Defines number of devices, expiry date of license for particular Client, It generates User specific code |
| UC2 | Registration | | X | User logins to Web interface using generated code and validates its licenses |
| UC3 | Asset Type Creation | | X | User creates lists of asset types, which his/her enterprise wants to track using narrator |
| UC4 | Define Asset Type Information | | X | User defines fields for basic asset information, defines actions, which can be performed on assets on particular type, uploads documents, which are related to asset type |
| UC5 | Configure Application settings | | X | User defines settings on how device and web (Cloud) can exchange data and specifies certain settings, which could be useful by device in updating assets |
| UC6 | Login to Device | X | | User logins to device and register itself to cloud |
| UC7 | Commission Asset | X | | User commissions tag and associate it to asset |
| UC8 | Update Asset | X | | User performs action on asset and/or links document to asset |
| UC9 | Audit Associated Assets | X | | User performs the audit of associated assets |
| UC10 | View Reports on Device | X | | User view various reports on device |
| UC11 | View Reports on Web interface | | X | User view various reports on web interface |
| UC12 | Clone Asset | X | | In case of missing/broken tag of the asset, User recreate tag from information available in cloud and associate the new tag to asset |
| UC12 | Find Asset | X | | Use to locate a particular asset or a group of assets that share some commonality |

The following provides a description of various use case embodiments for a narrator:

Case 1: License Creation
1. Login to Cloud as Administration
   a) Admin will enter user name/password, Web interface will authenticate and authorize user (Web Module: User Authenticator)
   b) only authorized and authenticated users will have access to this module
2. Add Information about customer
   a) Admin will enter Name, Location, Phone, Email, Account responsible in
3) Add information about number of devices, which customer is allowed to connect to Cloud
   a) Admin will enter no of devices, for which license is bought, (−1 for unlimited)
   b) Admin will also select, products in which client is interested (as of now, it will be Narrator)
   c) Admin will select readers for which license is bought
   d) Admin will select modules for which license is given
   e) Number of years of support is bought or given with license (−1 for infinite)
   f) Number of users, allowed to register (to use) (−1 for unlimited)
   g) Admin will also select platforms on which license should work
4. Add Expiry date of license
   a) Admin will also enter expiry date of license
5. Save information (Web Module: License Generator)
   a. All information will be saved in database
6. Unique number will be generated by Module (Web Module: Registration Code Generator)
   a. Code will be used to link all users from same organization of client
   b. Customer need to use this code to login to Web and device first item to identify themselves.
   c. Other users from same organization also need to use this code to register themselves with cloud console
7. Module will send generated code and URL to Hub, in an email to Client Email, Account responsible in and all admins. (Web Module: Send Code)
   a. URL can embed generated code, client ID and email (Web Module: URL Encoder)

TABLE 2

Database Requirements for use-case

| Category | Tables |
|---|---|
| Client Information | Static information such as Name, Location, email, phone, account |
| Client License (Enterprise) | License related information such as # of devices, expiry date, products, modules, readers, #service years, # of users, Platforms |
| Client Registration Code | Client ID and Generated Token |
| Roles | List of Roles (as of now Admin, User, Client_Admin, |

TABLE 2-continued

Database Requirements for use-case

| Category | Tables |
|---|---|
| | Client_Manager, Client_User) |
| Registered Devices | Client ID and list of registered devices |
| Registered Users | Client ID and list of registered users |
| Supported Readers | List of Supported Readers |
| Products | List of Products and their version |
| Platform | List of Platforms supported by Products |
| Modules | List of Modules of Products |
| Users | List of Users |

TABLE 3

Web Modules

| Category | Tables |
|---|---|
| Client Information | Static information such as Name, Location, email, phone |
| Client License (Enterprise) | License related information such as # of devices, expiry date, products, modules, readers, #service years, # of users, Platforms |
| Client Registration Code | Client ID and Generated Token |
| Roles | List of Roles (as of now Admin, User, Client_Admin, Client_Manager, Client_User) |
| Registered Devices | Client ID and list of registered devices |
| Registered Users | Client ID and list of registered users |
| Supported Readers | List of Supported Readers |
| Products | List of Products and their version |
| Platform | List of Platforms supported by Products |
| Modules | List of Modules of Products |
| Users | List of Users |

Case 2: Registration (By Client Admin)

1. On Reception of email, User clicks on URL mentioned in email
   a) URL can have code embedded in itself
   b) Login Page would extract basic information about user from URL like client name, code and It would request user to register (Web Module: URL Decoder)
2. User could here change email address, provide password (new/repeated) and code (if not filled in already)
   a) On submitting this data, Cloud module validates given code (Web Module: Registration Code Validator)
   i) Check if user is not already register with different code
   (1) Throw error in this case
   ii) if code is valid and not used before, User will be considered as "admin"
   iii) If code is valid and used before, user will be assigned role of "user"
   iv) Update number of registered users by 1 for this client
   v) Mark Generated code as used
3) If successful validation of code, User will be shown main page of Hub
4) User need to give user name and password at the time of registration, which he can use to login next time (Web Module: Register User against Code)
   a) He does not need to provide code next time.

TABLE 4

Registration (By Client Admin) - Database Requirement

| Category | Tables |
|---|---|
| Client Information | Static information such as Name, Location, email, phone |
| Registered Devices | Client ID & List of Registered Users |
| Registration Code | Client ID and Generated Token, Is Used |

TABLE 5

Registration (By Client Admin) - Web Modules

| Module | Description |
|---|---|
| Registration Code Validator | Check if user is not already register with different code<br>if code is valid and not used before, User will be considered as "admin"<br>If code is valid and used before, user will be assigned role of "user"<br>Update number of registered users by 1 for this client<br>Mark Generated code as used |
| Register User against Code/Client | 1) Register user for given client<br>2) Gets Client ID from Registration Code<br>3) Checks if User is already registered or not<br>4) Checks if number of allowed users has reached or not<br>5) Checks if Username and email is unique<br>6) If all above is OK, Register User in DB and send OK message<br>7) Otherwise send NOK with particular error message |
| URL Decoder | Extract Client information, Email and Code from URL |

Case 3: Asset Type Creation

An update log may be provided. For each action user takes in the hub, update log will be created, which will be used to sync information with devices. Each update/deletion/addition will be given number (Let's say hub index) (Initial value of hub index for each client will be 0 (if number)). Each device will have last synced hub index in its database (Initially it will be −1 (if number)). With every sync with device, device will ask for all updated after its last synced hub index: Hub gathers all updated based on last synced hub index and send device all updated along with latest value of hub index; On reception on device, device will update its last synced hub index value with latest value of hub index; Which will be useful on next sync; Hub index could be incremental number staring 0 or timestamp in long format; Hub index could be extra column in each related table.

1. Once Admin from Client logins to Hub, At this time user can (Web Module: User Authenticator)
   a) Manage asset types
   b) Manage enterprise documents
   c) Manage settings (See UC 5)
   d) View Reports (See UC 11)
2. In case, User click on "Manage Enterprise Documents"
   a) List of all already uploaded enterprise documents will be shown to user (if any) (Web Module: Document Lister)
   b) User can select any uploaded document and delete
   i) Document will be mark deleted (Web Module: Document Remover)

(1) In case documents are stored in file system, we can delete physical document but not database entry
(2) In case documents are stored in DB, we can empty column containing document but not database entry
ii) Action will be added in Update log
c) User can upload any new document (Web Module: Document Updater)
i) In case of same document name exists, throw error
ii) Otherwise save document (In database or in file system (TBD))
(1) Action will be added in Update log
3. In case, User click on "Manage Asset Types"
a) List of all already created asset types will be shown to user (if any) (Web Module: Asset Type Lister)
b) User can select any asset type and delete (Web Module: Asset Type Remover)
i) Asset type will be mark deleted
ii) Action will be added in Update log
c) User can create new asset type
i) User will be shown following fields
(1) Name
(2) Image
(3) Encoding Scheme for EPC (SGTIN, SSCC or ATA)
(a) Default Encoding Scheme will be ATA
(4) Documents specific to asset type
(a) User should be able to delete added documents before saving
ii) User has to provide at least name and image to save Asset type (Web Module: Asset Type Creator)
(1) On Save, in case of same asset type name exists, throw error
(2) Otherwise add new asset type
(a) Action will be added in Update log
d) User can click on Asset type and Edit
i) User can change any of the Asset type information
(1) User can delete any uploaded document (Web Module: Document Remover)
(a) Will be marked deleted in DB
(2) User can also upload new document (Web Module: Document Uploader)
(a) In case of same document name exists, throw error
(3) On Save, (Web Module: Asset Type Updater)
(a) In case of same asset type name exists, throw error
(b) Missing Image, Throw error
(c) Otherwise, Information will be updated in database
(i) All Actions will be added in Update log
d) User can click on Asset Type and Define (See UC 4)

TABLE 6

Asset Type Creation - Database Requirements

| Category | Tables |
|---|---|
| Update Log (Hub Index) | Last Used Hub Index per client |
| Enterprise Documents | Client ID and List of Documents |
| Asset Types | Client ID and List of Asset Types |
| Asset Type Documents | Asset Type ID and List of Documents |

TABLE 7

Asset Type Creation - Web Modules

| Module | Description |
|---|---|
| Asset Type Creator | Validate all inputs, create entry in database, creates update log (Web Module: Update Logger) |
| Asset Type Lister | Gets all asset types for given client |
| Asset Type Remover | Mark asset type as deleted and creates update log (Web Module: Update Logger) |
| Asset Type Updater | Update Asset type information and creates update log (Web Module: Update Logger) |
| Document Lister (Enterprise/Asset Type) | Gets all document names for given enterprise or given asset type |
| Document Uploader (Both type) | Saves document, adds entry into database with document name and link to document, creates update log (Web Module: Update Logger) |
| Document Remover (Both type) | Mark document as deleted and creates update log (Web Module: Update Logger) |
| Update Logger | Adds Hub Index as column in updated table and increases the index by 1 |
| User Authenticator | Authenticate user with user name and password |

Case 4: Define Asset Type Information
1) Once Admin from Client logins to Hub, At this time user can (Web Module: User Authenticator)
a) Manage asset types
b) Manage enterprise documents (See UC 3)
c) Manage settings (See UC 5)
d) View Reports (See UC 11)
2) In case, User click on "Manage Asset Types"
a) List of all already created asset types will be shown to user (if any) (Web Module: Asset Type Lister)
3) User selects Asset Type, he wants to define and click on define,
a) Asset Information Record is shown to User as Configurable List Creator control (Web Module: Asset Info Lister)
b) List of all Actions is shown to user (if any) with Add, Edit and Delete Button (Web Module: Asset Action Lister)
c) List of all associated asset types are shown to user (if any) with Add, Delete Button (Web Module: Associated Asset Lister)
4) To Manage Asset Information record
a) Configurable List creator will be shown to User (Web Module: Configurable List Control)
i) With default Group Name, "Asset Info"
b) If any fields are already created, these field will be shown
c) Configurable List creator allows user to add new field with its validation parameter
d) It also allows user to edit or delete any field
e) In case of any update to record, Action will be added to Update log (Web Module: Asset Info Updater)
5) On List of existing actions (if any) with Add, edit, Delete button
a) On Add Action, (Web Module: Asset Action Updater)
i) Configurable List creator will be shown to User (Web Module: Configurable List Control)
ii) Where Group name will be Action name
(1) action name must not be same as one of the existing actions
iii) Rest of steps are same from $2^{nd}$ bullet point under Step 4
b) On Edit Action (Web Module: Asset Action Updater)
i) Configurable List creator with already defined fields will be shown to User (Web Module: Configurable List Control)
ii) Action name will be group name of the Configurable list (1) In case of action name change, new name must not be same as one of the existing actions
iii) Rest of steps are same from 2$^{nd}$ bullet point under Step 4
c) On Delete Action (Web Module: Asset Action Remover)
i) Make selected action as deleted
ii) Action will be added to Update log
6) On List of Associated Asset Type
a) User can click on any existing linked asset type from List and click on Delete (Web Module: Associated Asset Remover)
i) Linked asset type will be marked deleted
ii) Action will be added to Update log
b) On Add, (Web Module: Associated Asset Updater)
i) Verify that current asset type is not already associated asset type of any other asset type, if yes, throw error
(1) If not, List of unlinked Asset types will be shown to user
(2) User can select one or many asset types and link it
(3) For every selected asset type, it will be checked that it does not have any associated asset types
(a) If yes, throw error and skip it
(b) If no, Link it as associated asset type
(i) Action will be added to Update log
ii) As of now, we are only supporting one level of association so associated asset type cannot have its own associated asset types.

TABLE 8

Define Asset Type Information - Database Requirements

| Category | Tables |
|---|---|
| Update Log (Hub Index) | Last Used Hub Index per client |
| Asset Types | Client ID and List of Asset Types |
| Asset Info | Asset Type ID and Asset Info record (as JSON) |
| Asset Actions | Asset Type ID, action name and action record (as JSON) |
| Associated Assets | Asset Type ID and Associated Asset Type IDs |

TABLE 9

Define Asset Type Information - Web Modules

| Module | Description |
|---|---|
| Asset Action Lister | Gets all actions specified for current asset types |
| Asset Action Remover | Marks action as deleted for current asset type and also updates log (Web Module: Update Logger) |
| Asset Action Updater (also adder) | Updates the given action with new definition and also updates log (Web Module: Update Logger) |
| Asset Association Lister | Gets all asset types associated with current asset type |
| Asset Association Remover | Removes the link between two asset types and also updates log (Web Module: Update Logger) |
| Asset Association Updater | Links given asset type with current asset type as associated asset type and also updates log (Web Module: Update Logger) |
| Asset Info Lister | Gets all information about Asset information record |
| Asset Infor Updater (also adder) | Updates/adds asset information record and also updates log (Web Module: Update Logger) |
| Asset Type Lister | Gets all asset types for given client |
| Configurable List Creator | UI Control, which allows user to create field, edit field, delete field and save list for a group |
| Update Logger | Adds Hub Index as column in updated table and increases the index by 1 |
| User Authenticator | Authenticate user with user name and password |

Case 5: Configure Application Settings
1) Once Admin from Client logins to Hub (Web Module: User Authenticator), At this time user can
a) Manage asset types (UC 4)
b) Manage enterprise documents (See UC 3)
c) Manage settings
d) View Reports (See UC 11)
2) In case, User click on "Manage Settings"
a) List of all registered devices will be shown to user (Web Module: Registered Devices Lister)
i) User can select any device and delete it
(1) Device will be marked deleted in DB (Web Module: Device Remover)
b) List of all registered users of his/her company & their current role, will be shown to user (Module: Registered Users Lister)
i) User can select any user and disable it
(1) Disabled user will no longer have access to both Hub and Product on device (Module: User Disabler)
iii) User can select any user and update his role
(1) User can choose between Admin/Manager and User (Web Module: Role Lister)
(2) If updated role is not current role, Role will be updated (Web Module: User Role Updater)
c) Following all application settings will also be shown to user and their values (Web Module: Current Application Settings Lister)
i) User can update value of any setting (Web Module: Client Setting Updater)
ii) Property Control could be used to display settings

TABLE 10

| Display settings | |
|---|---|
| Offline Support | In case of True; Device can work offline and cache all updates, will sync with cloud only when network is available, by default: True |
| Document caching | In case of True; Documents will be stored on device upon sync, instead of fetching from cloud, by default: True |
| Login Required | In case of True; User has to login to Application to use it, User has to register itself first on web, by default: True |
| Session Timeout | In case Login Required on Device is True, once user is logged in, His session will become invalid after session timeout, by default: 10000 minutes (7 days) |
| Allow Simulation mode | In case of True; User can use Simulated reader to demonstrate functionality of the Application: By default: True |
| Document Writing | In case of True: Complete document will be written to tag, in case of False: Only link to document will be written to tag, by default: False |
| Digital Certificate | By default: Blank If provided, Tag will be certifying with the digital certificate and all tag read will be verified against certificate for authenticity |
| Encryption Key | By default: Blank If provided, Tag data will be encrypted using key and will be decrypted after tag read. |
| Local Settings | True if Device user can allow to make changes to reader settings locally and use locally changes settings on device. |
| Language | |
| Time Zone | | d) User interface will also show all supported & allowed (as per license) readers and allow user to make selection
i) Once user makes selection of reader, Reader setting will be shown to user with their values (Web Module: Current Reader Settings Lister)

ii) User can update value of any setting (Web Module: Reader Setting Updater) iii) Property Control could be used to display settings e) User can select more than one reader (if any) and update setting of that reader too

TABLE 11

Configure Application Settings - Database Requirements

| Category | Tables |
|---|---|
| Update Log (Hub Index) | Last Used Hub Index per client |
| Product Settings | Product and Default Settings |
| Client Devices | Client ID and List of Registered Devices |
| Client Users | Client ID and List of Registered Users |
| Client Settings | Client ID and Specified Settings |

TABLE 12

Configure Application Settings - Web Modules

| Module | Description |
|---|---|
| User Authenticator | Authenticates the user |
| Update Logger | Updates Hub index and track changes in audit table |
| Product Setting Lister | Gets product specific settings and its default values |
| Client Setting Lister | Gets Client specified values for product settings |
| Current Setting Lister | Merges Clients values (Module: Client Setting Lister) and default values (Module: Product Setting Lister) for setting and return one list, which could be displayed in user interface |
| Client Setting Updater | Changes made in client setting will be updated in database and for change, update log will be added (Module: Update Logger) |
| Registered Devices Lister | Gets List of registered devices of current client as Observable Collection |
| Device Remover | Marks specified device as deleted in registered devices and adds update log (Module: Update Logger) |
| Registered Users Lister | Gets list of registered users from current client as Observable Collection |
| Role Lister | Gets List of all roles for Client as Observable Collection |
| User Disabler | Marks specified user as disabled in registered users and adds update log (Module: Update Logger) |
| User Role Updater | Updates role of specified user and adds update log (Module: Update Logger) |
| Client Reader Setting Lister | Gets the updated value of the reader settings |
| Reader Setting Lister | Merges Clients values (Module: Client Reader Setting Lister) and default values for setting and return one list, which could be displayed in user interface |
| Reader Setting Updater | Update the setting value for the reader in the Client reader settings |
| Reader List | Get list of all supported and allowed readers for this product & client |

Case 6: Login to Device

1) During initialization of the Application, Device will check for offline license file on device (Device Module: Validate License)
a) If License exists
i) If Valid
(1) If Login not required, go to Step 5 (Sync Process)
(2) If Login required, go to Step 4 (Login)
ii) If Not valid
(1) Throw error and Ask for registration code, Go to Step 2
b) If License does not exist
i) Ask for registration code, go to Step 2 (Code Verification)
2) Code Verification: Application will ask for Registration Code (Device Module: Registration Code Verifier)
a) It is same code given to client, when license was generated.
b) Once user specify the registration code, Registration code will be send to Hub for validation along with Device Information and Product Information (Interface: Register Device) (Device Module: Get Device Information) (Device Module: Get Product Information)
c) If Interface returns OK & License file for offline validation
i) Device now asks Hub if Login is required as per setting or not (Interface: Is Login Required)
(1) if Login is required as per returned Message, go to Step 3 (User Registration)
(2) If Login is not required as per returned Message, go to Step 5 (Sync Process)
d) If Interface returns NOK
i) Show error message to User and Ask user to contact administrator (End of function)
3) User Registration: Application asks user to provide First name, Last name, email, username and password to register
a) Once user provides these information, these information is sent to Hub (Interface: Register User)
i) If Interface replies with OK, go to Step 5 (Sync Process)
ii) If Interface replies with NOK, show error message to User and Ask user to contact administrator (End of function)
4) Login: Application asks for user name and password
a) Once user provides these information, these information is sent to Hub (Interface: Login User)
i) If Interface replies with OK, go to Step 5 (Sync Process)
ii) If Interface replies with NOK, show error message to User and Ask user to enter information again
5) Sync Process: (Device Module: Sync Device) Now Device begins sync process with the hub
a) In case, Network is not available then Sync process will exit and Application will show Main Page (Step 6) otherwise, Sync process will start
b) Check Update in License and see if License is still valid (Interface: Validate License)
i) If Process returns NOK, show returned error message and Ask user to contact administrator (End of function)
ii) Otherwise Process will return OK message and updated License if any
(1) If Updated license is returned, it will replace current offline license
c) Sync process will ask for latest Hub index (Interface: Get Hub Index)
i) If Latest hub index is same as device hub index, Sync process will exit
ii) Otherwise, sync process will continue
d) In case network goes between sync process during any of the previous update, all changes will be roll backed e) Now, Process Check Product Version and sees if Latest available product and current version of the product are same (Interface: Check Product Version)
  i) If Product version is not latest, user is requested to close the application and update it, though use can ignore message and continue
f) Sync process will ask for all updated Application settings since last Sync (Interface: Get Application Settings)
  i) List of all updated setting will be returned if any, all updated setting will be replaced in device
g) Sync process will ask for all updated Reader settings since last Sync (Interface: Get Reader Settings)
  i) List of all updated setting will be returned if any, all updated setting will be replaced in device
h) Then, Sync process will send device hub index and request latest list of asset types (Interface: Get Asset Types)
  i) If there are updates since last sync, Complete list of asset type will be send across, which will be replaced on device.
i) Following process will be repeated for each asset type
  i) Check if there are update in asset information such as Update Images, Encoding scheme information for given Asset type (Interface: Get Asset Type Information)
    (1) If there are updates since last sync, Complete asset type information will be send across, which will be replaced on device.
  ii) Check if there are update in Asset Type Documents for each Asset Type (Interface: Get Document List)
    (1) If there are update then List of all document names will be send, If List is not empty, List will be compared with available list of documents names
    (a) All removed document will be removed from devices
    (b) All added documents will be either added or replaced in device
      (i) In case Document caching is true, missing document will be downloaded one by one (Interface: Get Document)
  iii) Check if definition of asset type is updated after last sync (Interface: Get Asset Definition)
    (1) If asset info found in returned list, it will be added or replaced
    (2) If asset action found in returned list and definition is not empty, it will be added or replaced
    (3) If asset action found in returned list and definition is empty, it will be removed iv) Check if Associated asset types of asset type is updated after last sync (Interface: Get Associated Asset List)
    (1) If there are update then List of all associated asset types will be send, If List is not empty, List will be compared with available list of associated asset types
    (a) All removed associated asset type will be removed from devices
    (b) All added associated asset type will be either added
j) Check if there are update in Enterprise level Documents (Interface: Get Document List)
  i) If there are update then List of all document names will be send, If List is not empty, List will be compared with available list of documents names
    (1) All removed document will be removed from devices
    (2) All added documents will be either added or replaced in device
      (i) In case Document caching is true, missing document will be downloaded one by one (Interface: Get Document)
k) Sync process also download list of assets with alerts (Interface: Get Assets with Alerts)
  i) once list is return, it will be stored in device for later use
l) Updates local hub index with latest hub index in device
m) End of Sync process
6) At the end of Sync Process, Main screen is shown
  a) Application checks if there is any data to sync with Cloud (Device Module: Data to Sync)
    i) If there is data to sync, Alert will be shown on main screen so user can connect to network to push data to Hub
  b) Application connects to the reader (Device Module: Connect)
    i) In case of error connection reader, Reader will show error message to user and disable all reader related use case on application
    ii) User will have button on main to reconnect to reader when reader is ready

TABLE 13

External Interfaces

| Module | Description |
| --- | --- |
| Check Product Version (Client ID, Product Information) | if Product installed on device has lower version number than latest available Product, return NOK, otherwise send OK No longer product versions are already checked in Validate License module so it will not be checked again here |
| Get Application Settings (Client ID) | Get all updated application setting since last hub index and return as List; otherwise NULL |
| Get Asset Definition (Client ID, Asset Type, Hub Index) | if there is updated in Asset Information after given hub index then group name and definition will be added in Dictionary if there is updated/added asset action after given hub index then action name and its definition will be added to Dictionary too if there is deleted asset action after given hub index then action name with blank definition will be added to Dictionary. |
| Get Asset Type Information (Client ID, Asset Type, Hub Index) | If there is update on asset type information after given Hub index, send all asset type information to Device, otherwise NULL |
| Get Asset Types (Client ID, Hub Index) | If there are new asset types after given Hub index, all asset types will be returned, otherwise NULL |
| Get Assets with Alerts (Client ID, Hub Index) | Returns list of assets with alerts |
| Get Document List (Client ID, Asset Type, Hub Index) | if asset type is NULL then document name will be checks under enterprise document otherwise it will be checked under given asset type documents, if there is new document/replaced or removed document after given Hub index, list of all documents will be sent to device; otherwise NULL |
| Get Document (Client ID, Asset Type, Document Name) | if asset type is NULL then document name will be checks under enterprise document otherwise it will be checked under given asset type documents, if such document exists then document will be send across; otherwise NULL will be returned |

TABLE 13-continued

External Interfaces

| Module | Description |
| --- | --- |
| Get Hub Index (Client ID) | Returns updated hub index |
| Get Reader Settings (Client ID) | Get all updated reader setting since last hub index and return as List; otherwise NULL |
| Is Login Required (Client ID) | Check if Login is required as per Application settings and returns Boolean flag |
| Login User (Client ID, Product Information, User name, password) | Passes information to (Web Module: User Authenticator) which Boolean flag If User is authorized, it will be check if user is allowed to use product and that too for given client |
| Register Device (Product Information, Registration Code, Device Information) | Gets Client ID from Registration code Checks if License for Client is valid or not Checks if Client is allowed to use this product or not Checks if registration code is already used number of registered devices for client is not already exceeded It is one of the allowed & supported platform at least one asset type and its definition is available in DB, If all above is true then It will send OK message with offline license file (Web Module: License Generator) otherwise it will send NOK message with exact error message |
| Register User (Registration Code, User Information) | Passes information to (Web Module: Register User against code) which Gets Client ID from Registration Code Checks if User is already registered or not Checks if number of allowed users has reached or not Checks if Username and email is unique if all above is OK, Register User in DB and send OK message Otherwise send NOK with particular error message |
| Validate License (Client ID, Product Information, Device Information, String License) | Checks if there are changes in Hub, which required changes in License Like, Device is removed from Subscribed devices License is cancelled for Client Product version is no longer supported OS/OS version or Platform no longer supported if all above are false, Return OK with updated license if any; otherwise return NOK with error message |

TABLE 14

Login to Device - Database Requirements

| Category | Tables |
| --- | --- |
| Application Settings | Local Application Settings |
| Asset Types | List of Asset Types |
| Asset Information | Asset Information Records & Asset Action records |
| Associated Assets | List of associated assets of asset type |
| Client Information | Client Information |
| Documents | Asset Type level and equipment level document |
| License | Offline License |
| Product Settings | Product and Default Settings |
| Reader Settings | Local reader settings |
| Update Log (Hub Index) | Last Used Hub Index per client |

TABLE 15

Login to Device-Web Modules

| Module | Description |
| --- | --- |
| License Generator | Generates device specific license file from Enterprise License |
| Register User against code | Registers the user for a client Gets Client ID from Registration Code Checks if User is already registered or not Checks if number of allowed users has reached or not Checks if Username and email is unique If all above is OK, Register User in DB and send OK message Otherwise send NOK with particular error message |
| User Authenticator | Authenticate user based on given user name and password and returns status of authentication |

TABLE 16

Login to Device - Device Modules

| Module | Description |
| --- | --- |
| Connect to Reader | Application connect to reader, specified by Reader settings and applies the settings to reader as specified by Hub |
| Data to Sync | If there is asset update data to yet to sync with Hub, This method will return List of such updates |
| Get Device Information | Get Device OS, Device OS Version, Device Serial Number |
| Get Product Information | Get Product Name, Product Version |
| Registration Code Verifier | Sends Registration code to Hub and process the response from Hub |
| Sync Module | Synchronous device with latest update of Hub |
| Validate License | Checks if offline license is available, if yes Validates the license if License does not exist, it will be first usage of device and it will return −1 If License exists and it is not expired and login is not required, it will return 0 If License exists and it is not expired and login is required, it will return 1 if License exists and it is expired or corrupted, it will return −2 |

Case 7: Commission Asset
1. User clicks on "Read Asset" from Main Screen (Device Module: Get Tag List)
2. User clicks on one of the unknown EPC format (Hexadecimal format) to begin Asset Commissioning process
a. User interface shows Commission Asset type screen to user
b. List of existing asset types will be shown to user to select (Device Module: Get Asset Type List)
c. User can cancel operation at this time and scan for assets again
3. To begin the process, User selects one asset type to begin the process
a. As soon as asset type is selected,
i. Corresponding image and required field for Encoding scheme of EPC are shown (Device Module: Get Asset Type Information)
ii. Asset Type information fields are shown to user (Device Module: Get Asset Information)
4. User specify the values for encoding scheme fields and click on retrieve
a. If Retrieve finds an asset, Asset can be cloned (See UC 12)
i. Asset Type Information fields will be disabled
ii. Asset Information button will be shown to get more information about Asset
b. If Retrieve fails to a find an asset, New asset can be commissioned
c. User can clear given input and try again
5. To commission new asset, User has to provide information for at least all mandatory fields (Device Module: Configurable List)
a. Application will validate the values based on validation rules defined for each field
6. User clicks on Commissioning
a. Application writes both EPC and asset information record (Device Module: Write to Tag)
i. data will be compressed before written
ii. Image of the asset will not be stored in user memory
iii. If Digital certificate is provided, Certificate will be written to user memory too
iv. If Encryption is enabled, Data will be encrypted
v. If will be checked if tag is enough storage left to accommodate, this data, before actually write operation
vi. If there is storage, Data will be written to tag
vii. In case of error while writing tag, Module will retry several time but if command fails even after retry, Error message will be shown and asset will not be considered commissioned
b. In case of successful commissioning, Written data will be sync with Hub (Device Module: Sync Asset Updates) (Web Interface: Sync Asset Updates)

TABLE 17

External Interfaces

| Module | Description |
|---|---|
| Sync Asset Updates (Asset Type, Asset) | Send asset object across network to sync, Cloud will check updates in Asset object and writes update to database |

TABLE 18

Commission Asset - Database Requirements (On Device)

| Category | Description |
|---|---|
| Application Setting | Application settings |
| Asset Information | Basic asset information |
| Asset Type Lister | list of asset types |
| Asset Type Information | asset type id & asset type information |
| Asset Update Cache | Asset update cache |

TABLE 19

Commission Asset - Device Modules

| Module | Description |
|---|---|
| Configurable List | 1. configurable list will be shown, containing list of all fields, for which user can mention value<br>2. User enters values of fields, for which he wishes to provide value<br>  a. Validation framework will validate values, entered by users<br>3. User is only allowed to save list only if there are no validation errors |
| Get Asset Information | Returns asset information record from local storage, defined by Client in Hub |
| Get Asset Type Information | Returns asset type information such as Name, Image, Encoding scheme |
| Get Asset Type List | Returns the list of asset types from device storage |
| Get Tag List | Reader looks for all tags, which are in range of reader and returns them as list<br>In case of Known EPC format, Tag List also decode EPC as per encoding scheme<br>Otherwise Hex format will be used |
| Sync Asset Updates | Cache asset update data and sync to Hub if there is network<br>If data sync successfully, cache data will be deleted. |
| Write to Tag | Writes asset information record to User memory and EPC<br>1. Data will be compressed before written<br>2. Image of the asset will not be stored in user memory<br>3. If Digital certificate is provided, Certificate will be written to user memory too<br>4. If Encryption is enabled, Data will be encrypted<br>5. If will be checked if tag is enough storage left to accommodate, this data, before actually write operation<br>6. If there is storage, Data will be written to tag<br>7. In case of error while writing tag, Module will retry several time but if command fails even after retry, Error message will be shown and asset will not be considered commissioned |

Case 8: Update Assets
1. User clicks on "Read Asset" from Main Screen (Device Module: Get Tag List)
2. User clicks on one of the known EPC format (Tag URI format) to begin Asset update process
a. Application reads complete user memory for all records (Device Module: Read Tag Data)
i. Read data will be decompressed
ii. If digital certificate specified in settings of tag is not same as asset's digital certificate (if any), Error will be shown
iii. If decryption of data is not possible using key of asset type, error will be shown
iv. If not successful, User will ask to commission tag (See Use Case 7)

3. If Successful, read data will be parsed to extract asset information and asset action information (Device Module: Parse Tag Data)
a. User is shown with Asset Information, Image, all asset action records (if any), all documents/links (if any), alerts (if any) and validation errors (if any)
4. Application also downloads alerts information related to asset and its associated tags (if any) (Device Module: Get Asset Alerts)
a. If there are any alerts related to asset, it will be shown on Asset Page
5. At this time, User Can either
a. View Taken Action (if any)
b. Take Action
c. View linked Document
d. Add Document
e. Performs Audit of associated assets (if any associated assets)
f. Associate Other assets of allowed asset type (Enabled only if defined in asset definition)
6. On View Action (Device Module: Get Action Info)
a. On Click on Already written action name, Corresponding fields of action will b shown to user
b. Validation framework will check value of each field and if any alert needs to be raised, it will be raised.
c. User can go back to user information from action page
7. On Take Action (Device Module: Configurable List)
a. User will be asked to choose action type; which user would like to take (all actions are defined in Hub)
i. Based on Action type, configurable list will be shown, containing list of all fields, for which user can mention value
b. User enters values of fields, for which he wishes to provide value
i. Validation framework will validate values, entered by users
c. In additional, User can also set up alert, which will be shown when we read asset next time
d. Once save, Data will be written to tag (Device Module: Write to Tag)
i. User is only allowed to save action only if there are no validation errors
8. View Document: User clicks on name of any already written document from list of documents
a. In case of link, Document from link will be tried to extracted and if document exists, Document will be shown to user (Device Module: Get Linked Document)
i. In case of issue, error message will be shown to user
b. In case of document itself, Document will be constructed from stream of data and will be shown to user ((Device Module: Read Document)
9. Add Document: On click on Add document, List of documents will be shown to user (Device Module: Get Document List)
a. User clicks on document to view (download if not cached) (Device Module: Get Linked Document)
i. Get document if not cached (Interface: Get Document)
b. User can click on Save to write document to tag
i. Based on settings, either document or link to document will be written to tag (Device Module: Write to Tag)
10. Performs Audit of associated assets (See UC 9)
11. Associate Asset: User click on Associate Asset
a. Application will ask user to scan for nearby tags
b. Application reads tags which are nearby and filters them based on only allowed asset type's tag will be shown (Device Module: Get Filtered Tags)
c. List of filtered tag will be show to user
d. User can click on one or many discovered tags to build association
i. It will be checked that there is no cross association between assets
e. User saves association
i. Application saves association in tag (Device Module: Write to Tag)

TABLE 20

External Interfaces

| Category | Description |
| --- | --- |
| Application Setting | Application settings |
| Asset Alerts | List of assets with alerts |
| Asset Information | Basic asset information |
| Associated Asset Type | List of associated asset type |
| Asset Type Lister | list of asset types |
| Asset Type Information | asset type id & asset type information |
| Asset Update Cache | Asset update cache |

TABLE 21

Update Assets - Database Requirements (On Device)

| Category | Description |
| --- | --- |
| Application Setting | Application settings |
| Asset Alerts | List of assets with alerts |
| Asset Information | Basic asset information |
| Associated Asset Type | List of associated asset type |
| Asset Type Lister | list of asset types |
| Asset Type Information | asset type id & asset type information |
| Asset Update Cache | Asset update cache |

TABLE 22

Update Assets - Device Modules

| Module | Description |
| --- | --- |
| Configurable List | 1. configurable list will be shown, containing list of all fields, for which user can mention value<br>2. User enters values of fields, for which he wishes to provide value<br>  a. Validation framework will validate values, entered by users<br>3. User is only allowed to save list only if there are no validation errors |
| Get Asset Alerts | Gets alerts associated with asset if any |
| Get Action Info | Get action name, all field associated with action and their field values, based on written data in tag Validation will be performed on extracted data |
| Get Linked Document | Get Document from URL, return error if document does not exist at URL |
| Get Filtered Tags | Get tags, which are in range of reader and filter them based on allowed asset types for association |
| Get Tag List | Reader looks for all tags, which are in range of reader and returns them as list |

TABLE 22-continued

Update Assets - Device Modules

| Module | Description |
|---|---|
| Parse Read Data | In case of Known EPC format, Tag List also decode EPC as per encoding scheme<br>Otherwise Hex format will be used<br>Once Read Tag Data is successful, returned string will be parsed to convert in asset information |
| Read Document | Document will be constructed from data, read from tag |
| Read Tag Data | Reads complete tags<br>1. Read data will be decompressed<br>2. If digital certificate specified in settings of tag is not same as asset's digital certificate (if any), Error will be shown<br>3. If decryption of data is not possible using key of asset type, error will be shown<br>4. In case of error, error message will be returned |
| Sync Asset Updates | Cache asset update data and sync to Hub if there is network<br>If data sync successfully, cache data will be deleted. (Interface: Sync Asset Updates) |
| Write to Tag | Writes asset action record to User memory<br>1. Data will be compressed before written<br>2. Image of the asset will not be stored in user memory<br>3. If Digital certificate is provided, Certificate will be written to user memory too<br>4. If Encryption is enabled, Data will be encrypted<br>5. If will be checked if tag is enough storage left to accommodate, this data, before actually write operation<br>6. If there is storage, Data will be written to tag<br>7. All records will be written sequentially from beginning of the record<br>8. In case of error while writing tag, Module will retry several time but if command fails even after retry, Error message will be shown and asset will not be considered commissioned<br>9. In case of success. Cache data to Sync with Hub (Device Module: Sync Asset Updates) |

Case 9: Audit Associated Assets
1. User clicks on "Read Asset" from Main Screen (Device Module: Get Tag List)
2. User clicks on one of the known EPC format (Tag URI format) to begin Asset update process
3. If Successful, read data will be parsed to extract asset information and asset action information (Device Module: Parse Tag Data)
4. Application also downloads alerts information related to asset and its associated tags (if any) (Device Module: Get Asset Alerts)
5. At this time, User Can either
a. View Taken Action (if any) (See UC 8)
b. Take Action (See UC 8)
c. View linked Document (See UC 8)
d. Add Document (See UC 8)
e. Performs Audit of associated assets (if any associated assets)
f. Associate Other assets of allowed asset type (Enabled only if defined in asset definition) (See UC 8)
6. User clicks on Perform Audit of Associated Assets
a. List of already associated assets will be extracted from read tag data and will be shown to user (Device Module: Show Associated Assets)
b. Corresponding alerts will also be shown
7. Now user can look for actual associated tags by scanning tags
a. If reader finds a tag, which has same EPC ID as written associated tags, Corresponding entry on user interface will be marked (read)
8. User can click on any of the marked tag to see more information about it
a. Information about marked tag will be shown in Asset Page (Go back to UC 8)
b. User can anytime come back to this page by clicking on back

TABLE 23

Audit Associated Assets - Database Requirements (On Device)

| Category | Description |
|---|---|
| Application Setting | Application settings |
| Asset Alerts | List of assets with alerts |
| Asset Information | Basic asset information |
| Associated Asset Type | List of associated asset type |
| Asset Update Cache | Asset update cache |

TABLE 24

Audit Associated Assets - Device Modules

| Module | Description |
|---|---|
| Get Asset Alerts | Gets alerts associated with asset if any |
| Get Tag List | Reader looks for all tags, which are in range of reader and returns them as list<br>In case of Known EPC format, Tag List also decode EPC as per encoding scheme<br>Otherwise Hex format will be used |
| Parse Read Data | Once Read Tag Data is successful, returned string will be parsed to convert in asset information |
| Read Tag Data | Reads complete tags<br>1. Read data will be decompressed<br>2. If digital certificate specified in settings of tag is not same as asset's digital certificate (if any), Error will be shown<br>3. If decryption of data is not possible using key of asset type, error will be shown<br>4. In case of error, error message will be returned |
| Show Associated Assets | List of associated asset types will be extracted from tag read data and will be shown to user<br>Corresponding alerts will also be extracted from Storage and shown to user (Device Module: Get Asset Alerts) |
| Sync Asset Updates | Cache asset update data and sync to Hub if there is network<br>If data sync successfully, cache data will be deleted. (Interface: Sync Asset Updates) |

Case 10: Reports on Hub
Following are some of the example of reports, which can be generated on Hub
1. Activity Report
  a. Show number of active device per week (default last one year)
  b. Shows number of tags access per week across device (default last one year)
  c. Input:
  i. Duration (From/To) (Mandatory)
  1. Default One Year
  ii. Device (Optional)—List of Device, Select One or many
  d. Output
  i. Chart
  1. Device used by Week
  2. Tags access by Week (not read/only updated)
2. User audit report
  a. Shows which user has used, which device to perform which operation on which tag in specified time (by default last month)
  b. Input:
  i. User (Optional)—List of User, Select One or many
  ii. Device (Optional)—List of Device, Select One or many
  iii. Asset Type (Optional)—List of Asset Type, Select One or many
  c. Output:
  i. Table
3. Asset Type Report
  a. Shows assets by number of written records by given asset type
  b. Input:
  i. Asset Type (Optional)—List of Asset Type, Select One or many
  c. Output:
  i. Bar Chart with table below
4. Alert reports
  a. Shows all assets with alerts by given asset type (if specified; otherwise all asset types)
  b. Input:
  i. Action Type (Optional)—List of Asset Type, Select One or many
  c. Output:
  i. Table
5. Asset by Criteria report
  a. Shows all assets with giving field of given record with specified value
  b. Input:
  i. Action Type (Mandatory)—List of Asset Type, Select One
  ii. Encoding Scheme Fields
  1. Mandatory to fill one of them, Optional for others
  c. Output:
  i. Show list of assets
  ii. User can click on any of the asset
  1. Shows Asset Activity Report for selected asset
6/ Asset Timeline report
  a. Shows assets by last updated by (shown by default by quarter) by given asset type
  b. Input:
  i. Duration (From/To) (Optional)
  ii. Action Type (Mandatory)—List of Asset Type, Select One
  c. Output:
  i. Bar Chart with table below Case 11: Reports on Device
Following are some of the example of reports, which can be generated on Hub
1. Audit Report
  a. Shows whose login to device, each read and write operation performed, on which tag
  b. Input:
  i. User (Current)
  ii. Device (Current)
  iii. Asset Type (Optional)—List of Asset Type, Select One or many
  c. Output:
  i. Table
  2. TBD: (User can also fetch all reports available on console)

Case 12: Clone Asset
1. User clicks on "Read Asset" from Main Screen (Device Module: Get Tag List)
2. User clicks on one of the unknown EPC format (Hexadecimal format) to begin Asset Commissioning process
  a. User interface shows Commission Asset type screen to user
  b. List of existing asset types will be shown to user to select (Device Module: Get Asset Type List)
  c. User can cancel operation at this time and scan for assets again
3. To begin the process, User selects one asset type to begin the process
  a. As soon as asset type is selected,
  i. Corresponding image and required field for Encoding scheme of EPC are shown (Device Module: Get Asset Type Information)
  ii. Asset Type information fields are shown to user (Device Module: Get Asset Information)
4. User specify the values for encoding scheme fields and click on retrieve
  a. If Retrieve finds an asset, Asset can be cloned (See UC 12)
  i. Asset Type Information fields will be disabled
  ii. Asset Information button will be shown to get more information about Asset
  b. If Retrieve fails to a find an asset, New asset can be commissioned
  c. User can clear given input and try again
5. To Commission new asset, See UC 7
6. User can click on Asset Information button to get more information about Asset
  a. This button shows asset information on Asset Page (UC 8)
  i. All Asset Information will be fetched from Cloud (Interface: Get Asset Type Information) (Interface: Get Asset Information)
  ii. Go to Step 4 of UC 8
  b. This page also has Clone button
7. On Clone, Application writes Asset Type and Asset Information into Tag (Device Module: Write to Tag)
  a. In case of successful commissioning, Written data will be sync with Hub (Device Module: Sync Asset Updates) (Web Interface: Sync Asset Updates)
  b. User will be navigated back to main page
  c. In case of issue, Error message will be shown

TABLE 25

External Interfaces

| Module | Description |
|---|---|
| Get Asset Type Information (Client ID, Asset Type Information) | Returns asset type information such as Name, Image, Encoding scheme |
| Get Asset Information (Client ID, Encoding Scheme Information) | Returns asset information record (like actions, associated assets) from Cloud |
| Get Document (Client ID, Asset Type, Document Name) | if asset type is NULL then document name will be checks under enterprise document otherwise it will be checked under given asset type documents, if such document exists then document will be send across; otherwise NULL will be returned |
| Sync Asset Updates (Asset Type, Asset) | Send asset object across network to sync, Cloud will check updates in Asset object and writes update to database |

TABLE 26

Clone Asset - Database Requirements (On Device)

| Category | Description |
|---|---|
| Application Setting | Application settings |
| Asset Alerts | List of assets with alerts |
| Asset Information | Basic asset information |
| Associated Asset Type | List of associated asset type |
| Asset Type Lister | list of asset types |
| Asset Type Information | asset type id & asset type information |
| Asset Update Cache | Asset update cache |

TABLE 27

Clone Asset - Device Modules

| Module | Description |
|---|---|
| Configurable List | 1. configurable list will be shown, containing list of all fields, for which user can mention value<br>2. User enters values of fields, for which he wishes to provide value<br>  a. Validation framework will validate values, entered by users<br>3. User is only allowed to save list only if there are no validation errors |
| Get Asset Type List | Returns the list of asset types from device storage |
| Get Tag List | Reader looks for all tags, which are in range of reader and returns them as list<br>In case of Known EPC format, Tag List also decode EPC as per encoding scheme<br>Otherwise Hex format will be used |
| Sync Asset Updates | Cache asset update data and sync to Hub if there is network<br>If data sync successfully, cache data will be deleted. |
| Write to Tag | Writes asset information record to User memory and EPC<br>1. Data will be compressed before written<br>2. Image of the asset will not be stored in user memory |

TABLE 27-continued

Clone Asset - Device Modules

| Module | Description |
|---|---|
| | 3. If Digital certificate is provided, Certificate will be written to user memory too<br>4. If Encryption is enabled, Data will be encrypted<br>5. If will be checked if tag is enough storage left to accommodate, this data, before actually write operation<br>6. If there is storage, Data will be written to tag<br>7. In case of error while writing tag, Module will retry several time but if command fails even after retry, Error message will be shown and asset will not be considered commissioned |

While only a few embodiments have been shown and described, it will be obvious to those skilled in the art that many changes and modifications may be made thereunto without departing from the spirit and scope of the present disclosure as described in the following claims. All patent applications and patents, both foreign and domestic, and all other publications referenced herein are incorporated herein in their entireties to the full extent permitted by law.

The methods and systems described herein may be deployed in part or in whole through a machine that executes computer software, program codes, and/or instructions on a processor. The present disclosure may be implemented as a method on the machine, as a system or apparatus as part of or in relation to the machine, or as a computer program product embodied in a computer readable medium executing on one or more of the machines. The processor may be part of a server, client, network infrastructure, mobile computing platform, stationary computing platform, or other computing platform. A processor may be any kind of computational or processing device capable of executing program instructions, codes, binary instructions and the like. The processor may be or include a signal processor, digital processor, embedded processor, microprocessor or any variant such as a co-processor (math co-processor, graphic co-processor, communication co-processor and the like) and the like that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program instructions and the like described herein may be implemented in one or more thread. The thread may spawn other threads that may have assigned priorities associated with them; the processor may execute these threads based on priority or any other order based on instructions provided in the program code. The processor may include memory that stores methods, codes, instructions and programs as described herein and elsewhere. The processor may access a storage medium through an interface that may store methods, codes, and instructions as described herein and elsewhere. The storage medium associated with the processor for storing methods, programs, codes, program instructions or other type of instructions capable of being executed by the computing or processing device may include but may not be limited to one or more of a CD-ROM, DVD, memory, hard disk, flash drive, RAM, ROM, cache and the like.

A processor may include one or more cores that may enhance speed and performance of a multiprocessor. In embodiments, the process may be a dual core processor, quad core processors, other chip-level multiprocessor and the like that combine two or more independent cores (called a die).

The methods and systems described herein may be deployed in part or in whole through a machine that executes computer software on a server, client, firewall, gateway, hub, router, or other such computer and/or networking hardware. The software program may be associated with a server that may include a file server, print server, domain server, internet server, intranet server and other variants such as secondary server, host server, distributed server and the like. The server may include one or more of memories, processors, computer readable media, storage media, ports (physical and virtual), communication devices, and interfaces capable of accessing other servers, clients, machines, and devices through a wired or a wireless medium, and the like. The methods, programs, or codes as described herein and elsewhere may be executed by the server. In addition, other devices required for execution of methods as described in this application may be considered as a part of the infrastructure associated with the server.

The server may provide an interface to other devices including, without limitation, clients, other servers, printers, database servers, print servers, file servers, communication servers, distributed servers and the like. Additionally, this coupling and/or connection may facilitate remote execution of program across the network. The networking of some or all of these devices may facilitate parallel processing of a program or method at one or more location without deviating from the scope of the disclosed embodiments. In addition, any of the devices attached to the server through an interface may include at least one storage medium capable of storing methods, programs, code and/or instructions. A central repository may provide program instructions to be executed on different devices. In this implementation, the remote repository may act as a storage medium for program code, instructions, and programs.

The software program may be associated with a client that may include a file client, print client, domain client, internet client, intranet client and other variants such as secondary client, host client, distributed client and the like. The client may include one or more of memories, processors, computer readable media, storage media, ports (physical and virtual), communication devices, and interfaces capable of accessing other clients, servers, machines, and devices through a wired or a wireless medium, and the like. The methods, programs, or codes as described herein and elsewhere may be executed by the client. In addition, other devices required for execution of methods as described in this application may be considered as a part of the infrastructure associated with the client.

The client may provide an interface to other devices including, without limitation, servers, other clients, printers, database servers, print servers, file servers, communication servers, distributed servers and the like. Additionally, this coupling and/or connection may facilitate remote execution of program across the network. The networking of some or all of these devices may facilitate parallel processing of a program or method at one or more location without deviating from the scope of the disclosed embodiments. In addition, any of the devices attached to the client through an interface may include at least one storage medium capable of storing methods, programs, applications, code and/or instructions. A central repository may provide program instructions to be executed on different devices. In this implementation, the remote repository may act as a storage medium for program code, instructions, and programs.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules and/or components as known in the art. The computing and/or non-computing device(s) associated with the network infrastructure may include, apart from other components, a storage medium such as flash memory, buffer, stack, RAM, ROM and the like. The processes, methods, program codes, instructions described herein and elsewhere may be executed by one or more of the network infrastructural elements.

The methods, program codes, and instructions described herein and elsewhere may be implemented on a cellular network having multiple cells. The cellular network may either be frequency division multiple access (FDMA) network or code division multiple access (CDMA) network. The cellular network may include mobile devices, cell sites, base stations, repeaters, antennas, towers, and the like. The cell network may be a GSM, GPRS, 3G, EVDO, mesh, or other networks types.

The methods, programs codes, and instructions described herein and elsewhere may be implemented on or through mobile devices. The mobile devices may include navigation devices, cell phones, mobile phones, mobile personal digital assistants, laptops, palmtops, netbooks, augmented reality (AR) devices, virtual reality (VR) devices, head-worn devices, body-worn devices, pagers, electronic books readers, music players and the like. These devices may include, apart from other components, a storage medium such as a flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer-to-peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory (e.g. USB sticks or keys), floppy disks, magnetic tape, paper tape, punch cards, standalone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, and the like.

The methods and systems described herein may transform physical and/or or intangible items from one state to another. The methods and systems described herein may also transform data representing physical and/or intangible items from one state to another.

The elements described and depicted herein, including in flow charts and block diagrams throughout the figures, imply logical boundaries between the elements. However, according to software or hardware engineering practices, the depicted elements and the functions thereof may be implemented on machines through computer executable media having a processor capable of executing program instructions stored thereon as a monolithic software structure, as standalone software modules, or as modules that employ external routines, code, services, and so forth, or any combination of these, and all such implementations may be within the scope of the present disclosure. Examples of such machines may include, but may not be limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices having artificial intelligence, computing devices, networking equipment, servers, routers and the like. Furthermore, the elements depicted in the flow chart and block diagrams or any other logical component may be implemented on a machine capable of executing program instructions. Thus, while the foregoing drawings and descriptions set forth functional aspects of the disclosed systems, no particular arrangement of software for implementing these functional aspects should be inferred from these descriptions unless explicitly stated or otherwise clear from the context. Similarly, it will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods and/or processes described above, and steps thereof, may be realized in hardware, software or any combination of hardware and software suitable for a particular application. The hardware may include a general-purpose computer and/or dedicated computing device or specific computing device or particular aspect or component of a specific computing device. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine-readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software, or any other machine capable of executing program instructions.

Thus, in one aspect, each method described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

While the detailed description has been disclosed in connection with the preferred embodiments shown and described in detail, various modifications and improvements thereon will become readily apparent to those skilled in the art. Accordingly, the spirit and scope of the present disclosure is not to be limited by the foregoing examples, but is to be understood in the broadest sense allowable by law.

All documents referenced herein are hereby incorporated by reference.

What is claimed is:

1. An asset intelligence platform, comprising:
    a tag operating system comprising a central processing unit coupled to a memory, wherein the tag operating system is configured to operate, across a computer network in conjunction with a user operating on a computing device through a user interface, a plurality of RF asset tags and a plurality RF asset tag access devices to provide an operating environment, wherein the each of the plurality of RF asset tags are accessed by at least one of the plurality of RF asset tag access devices across an RF wireless communication interface, and wherein the user is able to exchange data with the plurality of RF asset tags remotely across the computer network by interacting with the user interface;
    a narrator application by which the user is enabled to manage information exchanged with the plurality of RF asset tag access devices;
    a cloud-based information hub application for user management of the information from the plurality of RF asset tags and the plurality of RF asset tag access devices located in disparate locations;
    a software library accessible by the tag operating system for providing at least one function that operates on the information exchanged with the plurality of RF asset tags; and
    a plug-in facility to provide an interface between the asset intelligence platform and the computing device, wherein the computing device is communicatively coupled to an information technology system of an enterprise,
    wherein, through the computing device, the user is able to remotely store and read the information with the plurality of RF asset tags across the computer network and through the plurality of RF asset tag access devices by operating within the user interface of the computing device, without regard to intervening interfaces and protocols associated with computing facilities communicatively connected between the computing device and the plurality of RF asset tags.

2. The asset intelligence platform of claim 1, wherein the asset intelligence platform provides local intelligence on the plurality of RF asset tags to the user.

3. The asset intelligence platform of claim 1, wherein the cloud-based information hub application manages the data comprising at least one of asset definitions, documents, images, asset updates, customer information, licensing information, or application settings.

4. The asset intelligence platform of claim 1, wherein the narrator application manages the information for the user comprising at least one of license creation, registration, asset type creation, definition of asset type information, configuration of application settings, logging into a device, commissioning an asset, updating the asset, auditing the asset, report generation, and cloning the asset.

5. The asset intelligence platform of claim 1, wherein the plurality of RF asset tags are at least one of attached to and integrated into assets, wherein the assets are at least one of a device, a machine, a system, an article of manufacture, a tool, an instrument, a vehicle, a component, and a part.

6. The asset intelligence platform of claim 1, wherein the plurality of RF asset tags comprises an RFID tag.

7. The asset intelligence platform of claim 1, wherein the plurality of RF asset tags comprises a near-field wireless device.

8. The asset intelligence platform of claim 1, wherein the plurality of RF asset tag access devices comprises an RFID reader.

9. The asset intelligence platform of claim 1, wherein the plurality of RF asset tag access devices comprises a cloud computing faculty.

10. The asset intelligence platform of claim 1, wherein the plurality of RF asset tag access devices comprises a mobile computing device.

11. The asset intelligence platform of claim 1, wherein the plurality of RF asset tag access devices comprises at least one of the plurality of RF asset tags.

12. The asset intelligence platform of claim 1, wherein the tag operating system operates across a plurality of wireless gateway protocols and RF asset tag access devices.

13. The asset intelligence platform of claim 1, wherein the user is enabled to manage the information associated with at least one of an asset origin authenticity, lifecycle maintenance history, and chain of custody.

14. The asset intelligence platform of claim 1, wherein the asset intelligence platform enables information management in an information technology system of the enterprise comprising at least one of aerospace, life science, healthcare, and manufacturing enterprises.

15. The asset intelligence platform of claim 1, wherein the tag operating system provides at least one of data encryption and data compression for the information exchanged between the computing device and the RF asset tags.

16. The asset intelligence platform of claim 1, wherein the software library is capable of securely storing both structured and unstructured data directly on and retrieving said data from the plurality of RF asset tags.

17. The asset intelligence platform of claim 1, wherein the tag operating system comprises a mobile application running on the computing device that provides a common interface to a plurality of different types of RF asset tag access devices.

18. The asset intelligence platform of claim 1, wherein the plug-in facility provides an interface between the asset intelligence platform and a plurality of distinct cloud-based enterprise computing systems interfacing with the information technology system of the enterprise such that the plurality of distinct cloud-based enterprise computing systems can access the data on the RF asset tags by using conventional data handling interfaces of enterprise computing systems.

* * * * *